(12) United States Patent
Zheng et al.

(10) Patent No.: US 11,176,863 B2
(45) Date of Patent: Nov. 16, 2021

(54) SHIFT REGISTER UNIT, GATE DRIVING CIRCUIT AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Mindong Zheng, Beijing (CN); Hui Wang, Beijing (CN); Yifeng Zou, Beijing (CN); Ruiying Yang, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/942,462

(22) Filed: Jul. 29, 2020

(65) Prior Publication Data

US 2021/0065601 A1 Mar. 4, 2021

(30) Foreign Application Priority Data

Aug. 26, 2019 (CN) .......................... 201910789649.9

(51) Int. Cl.
*G09G 3/20* (2006.01)
*G11C 19/28* (2006.01)
(52) U.S. Cl.
CPC ............... *G09G 3/20* (2013.01); *G11C 19/28* (2013.01); *G09G 2300/0426* (2013.01);
(Continued)

(58) Field of Classification Search
CPC ............. G09G 3/20; G09G 2300/0426; G09G 2310/0267; G09G 2310/0286; G09G 2310/08; G11C 19/28
See application file for complete search history.

(56) References Cited

U.S. PATENT DOCUMENTS 5,701,136 A 12/1997 Huq et al.
8,437,429 B2 * 5/2013 Jeon ................... H04L 25/4906
375/319

(Continued)

FOREIGN PATENT DOCUMENTS

CN 104064158 A 9/2014
CN 105609135 A 5/2016

(Continued)

OTHER PUBLICATIONS

First Office Action issued in corresponding CN application No. 201910789649.9 dated Feb. 1, 2021, with English translation (11 pages).

*Primary Examiner* — Sejoon Ahn
(74) *Attorney, Agent, or Firm* — Muncy, Geissler, Olds and Lowe, P.C.

(57) ABSTRACT

A shift register unit, a gate driving circuit and a display device are provided. The shift register unit includes a bias control circuit. The bias control circuit is electrically connected to a pull-down node, a control clock signal terminal, and a bias voltage terminal, respectively, and is configured to control connection between the pull-down node and the bias voltage terminal under the control of a control clock signal provided by the control clock signal terminal; and the bias voltage terminal is configured to input a bias voltage signal.

18 Claims, 10 Drawing Sheets

(52) U.S. Cl.
CPC ............... *G09G 2310/0267* (2013.01); *G09G 2310/0286* (2013.01); *G09G 2310/08* (2013.01)

(56) References Cited

U.S. PATENT DOCUMENTS

| | | | | |
|---|---|---|---|---|
| 8,847,431 | B2* | 9/2014 | Shido | H01L 23/5225 307/91 |
| 2003/0231735 | A1* | 12/2003 | Moon | G11C 19/28 377/64 |
| 2008/0106316 | A1* | 5/2008 | Ha | H03K 5/2481 327/299 |
| 2008/0266477 | A1* | 10/2008 | Lee | G11C 19/184 349/46 |
| 2010/0309191 | A1* | 12/2010 | Hsu | G11C 19/28 345/213 |
| 2013/0169609 | A1* | 7/2013 | Son | G09G 5/00 345/209 |
| 2016/0260403 | A1 | 9/2016 | Dai | |
| 2018/0130543 | A1* | 5/2018 | Zhu | G11C 27/04 |
| 2018/0197448 | A1 | 7/2018 | Zhang | |
| 2018/0294040 | A1 | 10/2018 | Hao et al. | |

FOREIGN PATENT DOCUMENTS

| | | |
|---|---|---|
| CN | 105810251 A | 7/2016 |
| CN | 205564249 U | 9/2016 |
| CN | 109448656 A | 3/2019 |
| CN | 110459189 A | 11/2019 |
| DE | 69625261 T2 | 9/2003 |

\* cited by examiner

SHIFT REGISTER UNIT, GATE DRIVING CIRCUIT AND DISPLAY DEVICE

CROSS-REFERENCE TO RELATED APPLICATION

The present application claims a priority of the Chinese patent application No. 201910789649.9 filed on Aug. 26, 2019, which is incorporated herein by reference in its entirety.

TECHNICAL FIELD

The present disclosure relates to the field of display technology, in particular to a shift register unit, a gate driving circuit and a display device.

BACKGROUND

With the rapid development of flat panel display technology, due to the high requirements of aesthetics by the customers and the continuous decline of the market price of the product, there is higher demands for the display quality of a thin film transistor-liquid crystal display (TFT-LCD). Nowadays, a TFT-LCD panel usually uses a Gate On Array (GOA, a gate driving circuit provided on the array substrate) technology. TFTs used in GOA is usually amorphous silicon (a-Si) TFTs or oxide TFTs. During the process of long-term reliability use, the threshold voltage of TFT drifts positively. When the threshold voltage drifts to a certain extent, it will affect the normal display of the display panel.

SUMMARY

The present disclosure provides a shift register unit including a bias control circuit. The bias control circuit is electrically connected to a pull-down node, a control clock signal terminal, and a bias voltage terminal, respectively, and is configured to control connection between the pull-down node and the bias voltage terminal under the control of a control clock signal provided by the control clock signal terminal; and the bias voltage terminal is configured to input a bias voltage signal.

In some embodiments of the present disclosure, the bias control circuit comprises a bias control transistor, a control electrode of the bias control transistor is electrically connected to the control clock signal terminal, a first electrode of the bias control transistor is electrically connected to the pull-down node, and a second electrode of the bias control transistor is electrically connected to the bias voltage terminal.

In some embodiments of the present disclosure, the pull-down node comprises a first pull-down node and a second pull-down node; the control clock signal terminal may include a first control clock signal terminal and a second control clock signal terminal; the bias voltage terminal comprises a first bias voltage terminal and a second bias voltage terminal; the bias control circuit comprises a first bias control transistor and a second bias control transistor; a control electrode of the first bias control transistor is electrically connected to the first control clock signal terminal, a first electrode of the first bias control transistor is electrically connected to the first pull-down node, and a second electrode of the first bias control transistor is electrically connected to the first bias voltage terminal; and a control electrode of the second bias control transistor is electrically connected to the second control clock signal terminal, a first electrode of the second bias control transistor is electrically connected to the second pull-down node, and a second electrode of the second bias control transistor is electrically connected to the second pull-down node.

In some embodiments of the present disclosure, the shift register unit further includes a pull-up node pull-down circuit and an output pull-down circuit. The pull-up node pull-down circuit is electrically connected to the pull-down node, the pull-up node, and the first voltage terminal, respectively, is configured to control connection between the pull-up node and the first voltage terminal under the control of the potential of the pull-down node; and the output pull-down circuit is electrically connected to the pull-down node, the gate driving signal output terminal, and the second voltage terminal, and is configured to control connection between the gate driving signal output terminal and the second voltage terminal under the control of the potential of the pull-down node.

In some embodiments of the present disclosure, the pull-up node pull-down circuit includes a pull-up node pull-down transistor, and the output pull-down circuit includes an output pull-down transistor, a control electrode of the pull-up node pull-down transistor is electrically connected to the pull-down node, a first electrode of the pull-up node pull-down transistor is electrically connected to the pull-up node, and a second electrode of the pull-up node pull-down transistor is electrically connected to the first voltage terminal; and a control electrode of the output pull-down transistor is electrically connected to the pull-down node, a first electrode of the output pull-down transistor is electrically connected to the gate driving signal output end, and a second electrode of the output pull-down transistor is electrically connected to the second voltage terminal.

In some embodiments of the present disclosure, the shift register unit further includes a carry signal pull-down circuit. The carry signal pull-down circuit is electrically connected to the pull-down node, a carry signal output terminal, and the third voltage terminal, respectively, and is configured to control connection between the carry signal output terminal and the third voltage terminal under the control of the potential of the pull-down node.

In some embodiments of the present disclosure, the shift register unit further includes a carry signal pull-down circuit. The carry signal pull-down circuit is electrically connected to the pull-down node, the carry signal output terminal, and the third voltage terminal, respectively, and is configured to control connection between the carry signal output terminal and the third voltage terminal under the control of the potential of the pull-down node.

In some embodiments of the present disclosure, the shift register unit further includes a pull-up node pull-down circuit and an output pull-down circuit. The pull-up node pull-down circuit is electrically connected to the first pull-down node, the second pull-down node, the pull-up node and the first voltage terminal, respectively, and is configured to control connection between the pull-up node and the first voltage terminal under the control of a potential of the first pull-down node and a potential of the second pull-down node; the output pull-down circuit is electrically connected to the first pull-down node, the second pull-down node, the gate driving signal output terminal, and the second voltage terminal, respectively, and is configured to control connection between the gate driving signal output terminal and the second voltage terminal under the control of the potential of the first pull-down node and the potential of the second pull-down node.

In some embodiments of the present disclosure, the pull-up node pull-down circuit includes a first pull-up node pull-down transistor and a second pull-up node pull-down transistor, and the output pull-down circuit includes a first output pull-down transistor and a second output pull-down transistor, a control electrode of the first pull-up node pull-down transistor is electrically connected to the first pull-down node, a first electrode of the first pull-up node pull-down transistor is electrically connected to the pull-up node, and a second electrode of the first pull-up node pull-down transistor is electrically connected to the first voltage terminal; a control electrode of the second pull-up node pull-down transistor is electrically connected to the second pull-down node, a first electrode of the second pull-up node pull-down transistor is electrically connected to the pull-up node, and a second electrode of the second pull-up node pull-down transistor is electrically connected to the first voltage terminal; a control electrode of the first output pull-down transistor is electrically connected to the first pull-down node, a first electrode of the first output pull-down transistor is electrically connected to the gate driving signal output terminal, and a second electrode of the first output pull-down transistor is electrically connected to the second voltage terminal; and a control electrode of the second output pull-down transistor is electrically connected to the second pull-down node, a first electrode of the second output pull-down transistor is electrically connected to the gate driving signal output terminal, and a second electrode of the second output pull-down transistor is electrically connected to the second voltage terminal.

In some embodiments of the present disclosure, the shift register unit further includes a carry signal pull-down circuit. The carry signal pull-down circuit is electrically connected to the first pull-down node, the second pull-down node, the carry signal output terminal, and the third voltage terminal, and is configured to control connection between the carry signal output terminal and the third voltage terminal under the control of the potential of the first pull-down node and the potential of the second pull-down node.

In some embodiments of the present disclosure, the carry signal pull-down circuit includes a first carry signal pull-down transistor and a second carry signal pull-down transistor; a control electrode of the first carry signal pull-down transistor is electrically connected to the first pull-down node, a first electrode of the first carry signal pull-down transistor is electrically connected to the carry signal output terminal, and a second electrode of the first carry signal pull-down transistor is electrically connected to the third voltage terminal; and a control electrode of the second carry signal pull-down transistor is electrically connected to the second pull-down node, a first electrode of the second carry signal pull-down transistor is electrically connected to the carry signal output terminal, and a second electrode of the second carry signal pull-down transistor is electrically connected to the third voltage terminal.

In some embodiments of the present disclosure, the shift register unit further includes a first pull-down node control circuit and a second pull-down node control circuit. The first pull-down node control circuit is electrically connected to a first control voltage terminal, the pull-up node, the first pull-down node, and a fourth voltage terminal, respectively, and is configured to control the potential of the first pull-down node under the control of the first control voltage provided by the first control voltage terminal and the potential of the pull-up node; and the second pull-down node control circuit is electrically connected to a second control voltage terminal, the pull-up node, the second pull-down node, and a fourth voltage terminal, respectively, is configured to control the potential of the second pull-down node under the control of a second control voltage provided by the second control voltage terminal and the potential of the pull-up node; the first control clock signal terminal is the second control voltage terminal, and the second control clock signal terminal is the first control voltage terminal.

In some embodiments of the present disclosure, the shift register unit further includes a pull-up node control circuit and a gate driving output circuit. The pull-up node control circuit is configured to control the potential of the pull-up node; the gate driving output circuit is configured to control the gate driving signal outputted by the gate driving signal output terminal under the control of the potential of the pull-up node.

In some embodiments of the present disclosure, the pull-up node control circuit includes an input transistor, a reset transistor, and a start transistor, a control electrode of the input transistor and a first electrode of the input transistor are electrically connected to the input terminal, and a second electrode of the input transistor is electrically connected to the pull-up node; a control electrode of the reset transistor is electrically connected to the reset terminal, a first electrode of the reset transistor is electrically connected to the pull-up node, and a second electrode of the reset transistor is connected to a first low voltage; a control electrode of the starting transistor is electrically connected to a starting terminal, a first electrode of the starting transistor is electrically connected to the pull-up node, and a second electrode of the starting transistor is connected to the first low voltage, the gate driving output circuit includes an output transistor and a storage capacitor, a control electrode of the output transistor is electrically connected to the pull-up node, a first electrode of the output transistor is electrically connected to the first clock signal terminal, and a second electrode of the output transistor is electrically connected to the gate driving signal output terminal, the first clock signal terminal is used to provide a first clock signal; and a first end of the storage capacitor is electrically connected to the pull-up node, and a second end of the storage capacitor is electrically connected to the gate driving signal output end.

In some embodiments of the present disclosure, the input terminal is electrically connected to the driving signal output terminal in an adjacent previous stage or the carry signal output terminal in an adjacent previous stage, and the reset terminal is connected to the gate driving signal output terminal in an adjacent next stage or the carry signal output terminal in the adjacent next stage.

In some embodiments of the present disclosure, the shift register unit further includes a carry signal output circuit, wherein the carry signal output circuit is configured to control the carry signal outputted by the carry signal output terminal under the control of the potential of the pull-up node.

In some embodiments of the present disclosure, the carry signal output circuit comprises a carry signal output transistor, a control electrode of the carry signal output transistor is electrically connected to the pull-up node, a first electrode of the carry signal output transistor is electrically connected to the first clock signal terminal, and a second electrode of the carry signal output transistor is electrically connected to the carry signal output terminal.

An embodiment of the present disclosure further provides a gate driving circuit including a plurality of stages of shift register units.

An embodiment of the present disclosure further provides a display device, including the gate driving circuit.

DETAILED DESCRIPTION

The technical solutions in the embodiments of the present disclosure will be described clearly and completely with reference to the drawings in the embodiments of the present disclosure, and it is obvious that the embodiments described are only some embodiments of the present disclosure, rather than all embodiments. All other embodiments, which can be derived by a person skilled in the art from the embodiments disclosed herein without making any creative effort, shall fall within the protection scope of the present disclosure.

The transistors used in all embodiments of the present disclosure may be transistors, thin film transistors, or field effect transistors or other devices with the same characteristics. In the embodiments of the present disclosure, to distinguish two electrodes of a transistor except for a control electrode, one electrode is referred to as a first electrode, and the other electrode is referred to as a second electrode.

In practical operation, for a transistor, the control electrode may be a base electrode, the first electrode may be a collector electrode, and the second electrode may be an emitter electrode. Alternatively, the control electrode may be a base electrode, the first electrode may be an emitter electrode, and the second electrode may be a collector electrode.

In practical operation, when the transistor is a thin film transistor or a field effect transistor, the control electrode may be a gate electrode, the first electrode may be a drain electrode, and the second electrode may be a source electrode. Alternatively, the control electrode may be a gate electrode, the first electrode may be a source electrode, and the second electrode may be a drain electrode.

Figure 1:
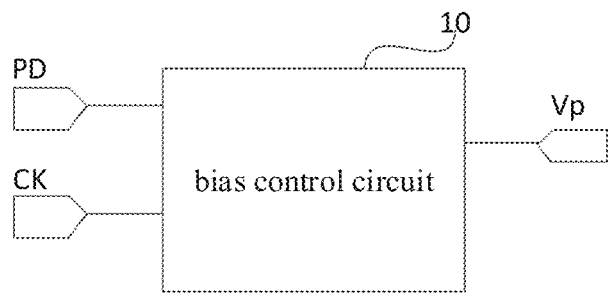
FIG. 1 is a structural diagram of a shift register unit according to an embodiment of the disclosure.

As shown in FIG. 1, the shift register unit according to the embodiment of the present disclosure includes a bias control circuit 10. The bias control circuit 10 is electrically connected to a pull-down node PD, a control clock signal terminal CK, and a bias voltage terminal Vp, respectively, and is used to control the connection between the pull-down node PD and the bias voltage terminal Vp under the control of the control clock signal provided by the control clock signal terminal CK.

The bias voltage terminal Vp is used to input a bias voltage signal.

In the shift register unit according to the embodiment of the present disclosure, the bias control circuit 10 is used to control the connection between the pull-down node PD and the bias voltage terminal Vp under the control of the control clock signal provided by the control clock signal terminal CK, to control a transistor whose gate electrode is connected to the pull-down node PD being in a reverse bias state, which can compensate for the threshold voltage drift when the transistor is turned on, improve a turned-on current Ion of the transistor during the process of reliability, avoid related defects, and improve the working life of the shift register.

In a specific implementation, the voltage value of the bias voltage signal is within a predetermined voltage range.

In the shift register described in the embodiment of the present disclosure, when the transistor whose gate electrode is connected to the pull-down node PD is in a reverse bias state, the threshold voltage of the transistor can be reversely compensated.

In the embodiments of the present disclosure, the predetermined voltage range can be selected according to actual conditions.

In a specific implementation, when the shift register unit according to the embodiment of the present disclosure adopts one pull-down node, the transistor whose gate electrode is electrically connected to the pull-down node in the shift register unit according to the embodiment of the present disclosure may include an output pull-down transistor and a pull-up node pull-down transistor.

A control electrode of the pull-up node pull-down transistor may be electrically connected to the pull-down node, a first electrode of the pull-up node pull-down transistor may be electrically connected to the pull-up node, and a second electrode of the output pull-down transistor may be connected to a first low voltage VGL1.

A control electrode of the output pull-down transistor may be electrically connected to the pull-down node, a first electrode of the output pull-down transistor may be electrically connected to a gate driving signal output terminal, and a second electrode of the output pull-down transistor may be connected to a second low voltage VGL2.

In an embodiment of the present disclosure, when the output pull-down transistor and the pull-up node pull-down transistor are n-type transistors, the bias control circuit 10 controls the disconnection between the pull-down node PD and the bias voltage terminals Vp under the control of the control clock signal, the potential of the pull-down node PD is at a high level, and the output pull-down transistor and the pull-up node pull-down transistor are turned on. At this time, the gate-source voltage of the output pull-down transistor is greater than the threshold voltage of the output pull-down transistor. The gate-source voltage of the pull-up node pull-down transistor is greater than the threshold voltage of the pull-up node pull-down transistor, which will cause the threshold voltage of the output pull-down transistor to drift positively, and the threshold voltage of the pull-up node pull-down transistor to drift positively. When the output pull-down transistor and the pull-up node pull-down transistor are n-type transistors, the bias voltage signal may be a third low voltage signal, and the potential of the third low voltage signal is a third low voltage VGL3, VGL3 is less than VGL1, and VGL3 is less than VGL2 at this time, so that when the bias control circuit 10 controls the connection between the pull-down node PD and the bias voltage terminal Vp under the control of the control clock signal, the potential of the pull-down node PD is VGL3, so as to control the output pull-down transistor and the pull-up node pull-down transistor to be in a reverse bias state, thereby improving the threshold voltage drift of the output pull-down transistor and improve the threshold voltage drift of the pull-up node pull-down transistor. When the output pull-down transistor and the pull-up node pull-down transistor are n-type transistors, the predetermined voltage range may be less than the first low voltage VGL1 and less than the second low voltage VGL2, but not limited to this.

When the output pull-down transistor is a p-type transistor, when the bias control circuit 10 controls the disconnection between the pull-down node PD and the bias voltage terminal Vp under the control of the control clock signal, the potential of the pull-down node PD is a low level, the output pull-down transistor and the pull-up node pull-down transistor are turned on. At this time, the gate-source voltage of the output pull-down transistor is less than the threshold voltage of the output pull-down transistor, and the gate-source voltage of the pull-up node pull-down transistor is less than the threshold voltage of the pull-up node pull-down transistor, which will cause the threshold voltage of the output pull-down transistor to drift negatively, and cause the threshold voltage of the pull-up node pull-down transistor to drift negatively. When the output pull-down transistor and the pull-up node pull-down transistor are p-type transistors, the bias voltage signal may be a third low voltage signal, and the potential of the third low voltage signal is the third low voltage VGL3. At this time, VGL3 is greater than VGL1, and VGL3 is greater than VGL2. Under the control of the control clock signal, the bias control circuit 10 controls the connection between the pull-down node PD and the bias voltage terminal Vp, so that the potential of the pull-down node PD is VGL3, so as to control the gate-source voltage of the output pull-down transistor and the gate-source voltage of the pull-up node pull-down transistor are both greater than 0, so that the threshold voltage drift of the output pull-down transistor and the threshold voltage drift of the pull-up node pull-down transistor can be improved; when the output pull-down transistor and the pull-up node pull-down transistor are p-type transistors, the predetermined voltage range may be greater than the first low voltage VGL1 and greater than the second low voltage VGL2, but is not limited to this.

In an embodiment of the present disclosure, in order to realize XON separation, VGL2 is an independent voltage, but when the display panel works normally, VGL2 can be equal to VGL1. When the display panel is turned off, the potential of the second low voltage terminal will be pulled up to a high voltage VGH, but not limited to this.

XON separation refers to the shutdown separation. The first low-voltage terminal and the second low-voltage terminal are separated. When the display panel is turned off, only the potential of the second low-voltage terminal is pulled up to VGH, so that the potential of gate driving signals in all rows is high to release the remaining charge.

In an embodiment of the present disclosure, according to the TFT characteristic curve, VGL3 can be greater than −15V, but it is not limited thereto.

In a specific implementation, when the shift register unit described in the embodiment of the present disclosure adopts one pull-down node, the shift register unit described in the embodiment of the present disclosure may include an output transistor, and a control electrode of the output transistor may be connected to the pull-up node, a first electrode of the output transistor can be connected to the first clock signal CLK, and a second electrode of the output transistor is electrically connected to the gate driving signal output terminal. At this time, the control clock signal can be the second clock signal CLKB, the first clock signal CLK and the second clock signal CLKB are inverted in phase.

Specifically, the bias control circuit may include a bias control transistor. A control electrode of the bias control transistor is electrically connected to the control clock signal terminal, a first electrode of the bias control transistor is electrically connected to the pull-down node, and a second electrode of the bias control transistor is electrically connected to the bias voltage terminal.

Figure 2:
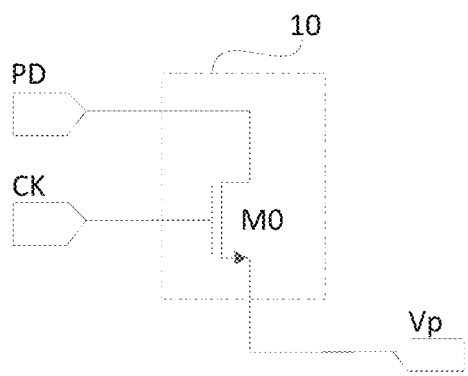
FIG. 2 is a circuit diagram of a shift register unit according to an embodiment of the present disclosure.

As shown in FIG. 2, based on the shift register unit shown in FIG. 1, the bias control circuit 10 may include a bias control transistor M0. A gate electrode of the bias control transistor M0 is electrically connected to the control clock signal terminal CK, a source electrode of the bias control transistor M0 is electrically connected to the pull-down node PD, and a drain electrode of the bias control transistor M0 is electrically connected to the bias voltage terminal Vp.

In the embodiment shown in FIG. 2, M0 is an n-type thin film transistor, but it is not limited to this.

Figure 3:
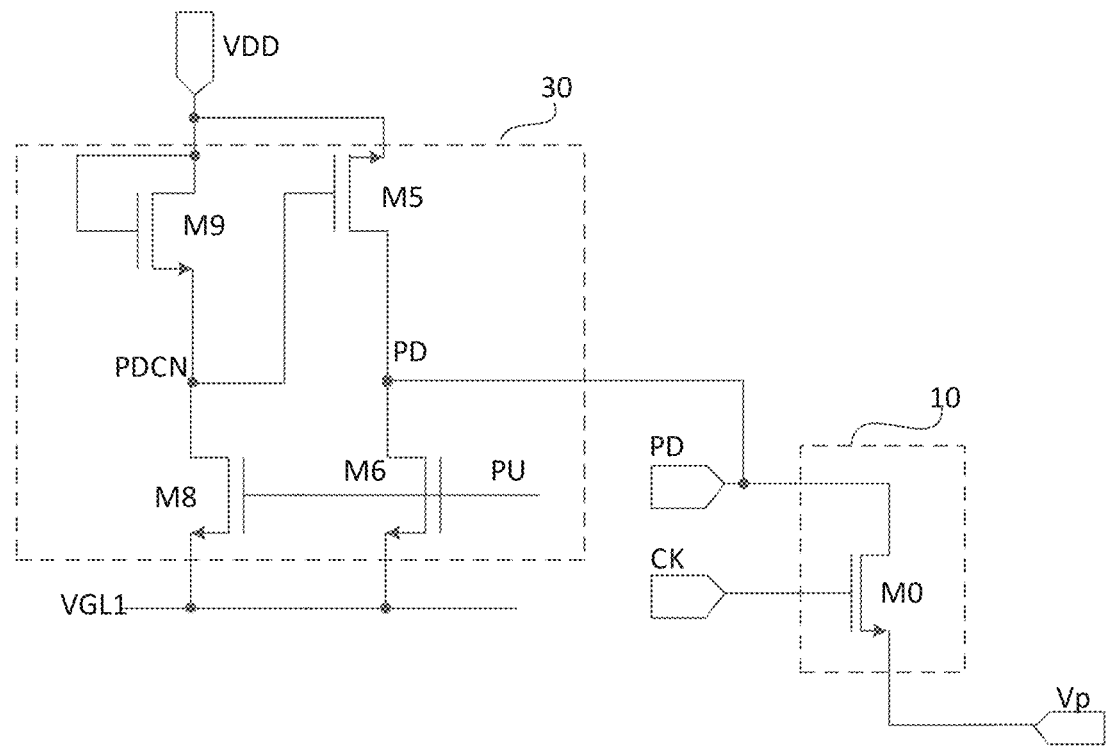
FIG. 3 is another structural diagram of a shift register unit according to an embodiment of the present disclosure.

When the shift register unit according to the embodiment of the present disclosure includes one pull-down node PD, on the basis of the shift register unit shown in FIG. 1, as shown in FIG. 3, the shift register unit 30 may also include a pull-down node control circuit 30.

As shown in FIG. 3, the pull-down node control circuit 30 may include a first control transistor M9, a second control transistor M8, a third control transistor M5, and a fourth control transistor M6.

A gate electrode of M9 and a drain electrode of M9 are both connected to the high voltage VDD, and a source electrode of M9 is electrically connected to the pull-down control node PDCN.

A gate electrode of M8 is electrically connected to the pull-up node PU, a drain electrode of M8 is electrically connected to the pull-down control node PDCN, and a source electrode of M8 is connected to the first low voltage VGL1.

A gate electrode of M5 is electrically connected to the pull-down control node PDCN, a source electrode of M5 is connected to the high voltage VDD, and a drain electrode of M5 is electrically connected to the pull-down node PD.

A gate electrode of M6 is electrically connected to the pull-up node PU, a drain electrode of M6 is electrically connected to the pull-down node PD, and a source electrode of M6 is connected to the first low voltage VGL1.

In the embodiment shown in FIG. 3, each transistor is an n-type thin film transistor, but it is not limited thereto.

In the embodiment shown in FIG. 3, the width to length ratio of M8 is greater than that of M9, the width to length ratio of M6 is greater than that of M5, and when the bias control circuit 10 may include a bias control transistor M0, the width to length ratio of M0 is greater than that of M5, but not limited to this.

Specifically, the shift register unit according to the disclosed embodiment of the present disclosure may further include a pull-up node pull-down circuit and an output pull-down circuit.

The pull-up node pull-down circuit is electrically connected to the pull-down node, the pull-up node, and the first voltage terminal, respectively, is used to control the connection between the pull-up node and the first voltage terminal under the control of the potential of the pull-down node.

The output pull-down circuit is electrically connected to the pull-down node, the gate driving signal output terminal, and the second voltage terminal, and is used to control the connection between the gate driving signal output terminal and the second voltage terminal under the control of the potential of the pull-down node.

In a specific implementation, the shift register unit described in the disclosed embodiment of the present disclosure may also include a pull-up node pull-down circuit and an output pull-down circuit. The pull-up node pull-down circuit controls the connection between the pull-up node and the first voltage terminal under the control of the potential of the pull-down node. The output pull-down circuit controls the gate driving signal output terminal to output a second voltage signal under the control of the pull-down node.

In the embodiment of the present disclosure, the first voltage terminal may be a first low voltage terminal, and the second voltage terminal may be a second low voltage terminal, but it is not limited to this.

Figure 4:
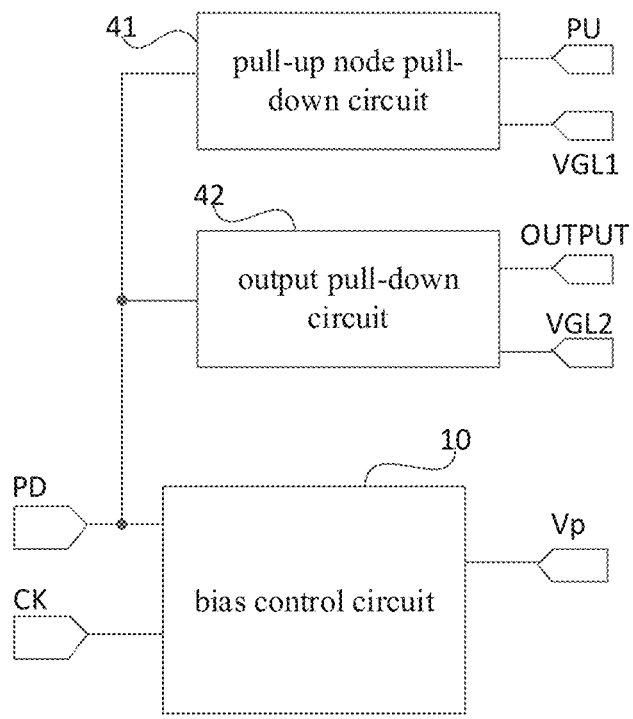
FIG. 4 is yet another structural diagram of a shift register unit according to an embodiment of the present disclosure.

As shown in FIG. 4, based on the shift register unit shown in FIG. 1, the shift register unit described in the embodiment of the disclosure may further include a pull-up node pull-down circuit 41 and an output pull-down circuit 42.

The pull-up node pull-down circuit 41 is electrically connected to the pull-down node PD, the pull-up node PU, and the first low voltage terminal, respectively, and is used to control the pull-up node PU to receive the first low voltage VGL1 under the control of the potential of the pull-down node PD; the first low voltage terminal is used to provide the first low voltage VGL1.

The output pull-down circuit 42 is electrically connected to the pull-down node PD, the gate driving signal output terminal OUTPUT, and the second low voltage terminal, respectively, is used to control the gate driving signal output terminal to receive the second low voltage VGL2 under the control of the potential of the pull-down node; the second low voltage terminal is used to provide the second low voltage VGL2.

Specifically, the pull-up node pull-down circuit may include a pull-up node pull-down transistor, and the output pull-down circuit may include an output pull-down transistor.

A control electrode of the pull-up node pull-down transistor is electrically connected to the pull-down node, a first electrode of the pull-up node pull-down transistor is electrically connected to the pull-up node, and a second electrode of the pull-up node pull-down transistor is electrically connected to the first voltage terminal.

A control electrode of the output pull-down transistor is electrically connected to the pull-down node, a first electrode of the output pull-down transistor is electrically connected to the gate driving signal output end, and a second electrode of the output pull-down transistor is electrically connected to the second voltage terminal.

In a specific implementation, the pull-up node pull-down transistor and the output pull-down transistor are both n-type transistors, the voltage value of the bias voltage signal is less than the first voltage, and the voltage value of the bias voltage signal is less than the second voltage.

Alternatively, both the pull-up node pull-down transistor and the output pull-down transistor are p-type transistors, the voltage value of the bias voltage signal is greater than the first voltage, and the voltage value of the bias voltage signal is greater than the second voltage.

The first voltage terminal is used to input a first voltage signal, the voltage value of the first voltage signal is the first voltage; the second voltage terminal is used to input a second voltage signal, the voltage value of the second voltage signal is the second voltage.

Figure 5:
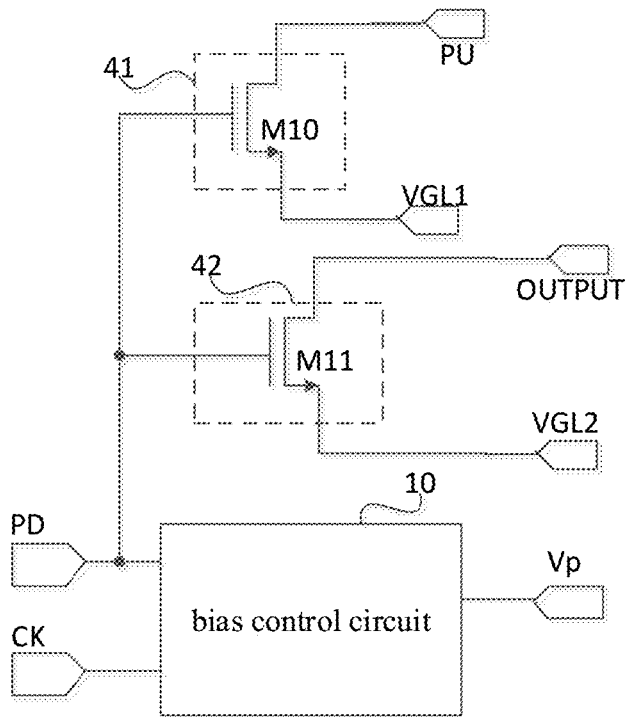
FIG. 5 is still yet another structural diagram of a shift register unit according to an embodiment of the present disclosure.

As shown in FIG. 5, based on the shift register unit shown in FIG. 4, the pull-up node pull-down circuit 41 may include a pull-up node pull-down transistor M10, and the output pull-down circuit 42 may include an output pull-down. Transistor M11.

A gate electrode of M10 is electrically connected to the pull-down node PD, a drain electrode of M10 is electrically connected to the pull-up node PU, and a source electrode of M10 is connected to the first low voltage VGL1.

A gate electrode of M11 is electrically connected to the pull-down node PD, a drain electrode of M11 is electrically connected to the gate driving signal output terminal OUTPUT, and a source electrode of M11 is connected to the second low voltage VGL2.

In the embodiment of the shift register unit shown in FIGS. 5, M10 and M11 are n-type thin film transistors, but not limited to this.

In the shift register unit shown in FIG. 5, when the bias voltage signal is a third low voltage signal and the potential of the third low voltage signal is the third low voltage VGL3, VGL3 is less than VGL1, and VGL3 is smaller than VGL2, so that when the bias control circuit 10 controls the connection between the pull-down node PD and the bias voltage terminal Vp, at this time, M10 and M11 are in a reverse bias state to improve the threshold voltage drift of M10 and improve the threshold voltage drift of M11.

In a specific implementation, the shift register unit described in the present disclosure may further include a carry signal pull-down circuit.

The carry signal pull-down circuit is electrically connected to the pull-down node, a carry signal output terminal, and the third voltage terminal, respectively, and is used to control the connection between the carry signal output terminal and the third voltage terminal under the control of the potential of the pull-down node.

In a specific implementation, the third voltage terminal may be the first low voltage terminal, but is not limited to this.

Figure 6:
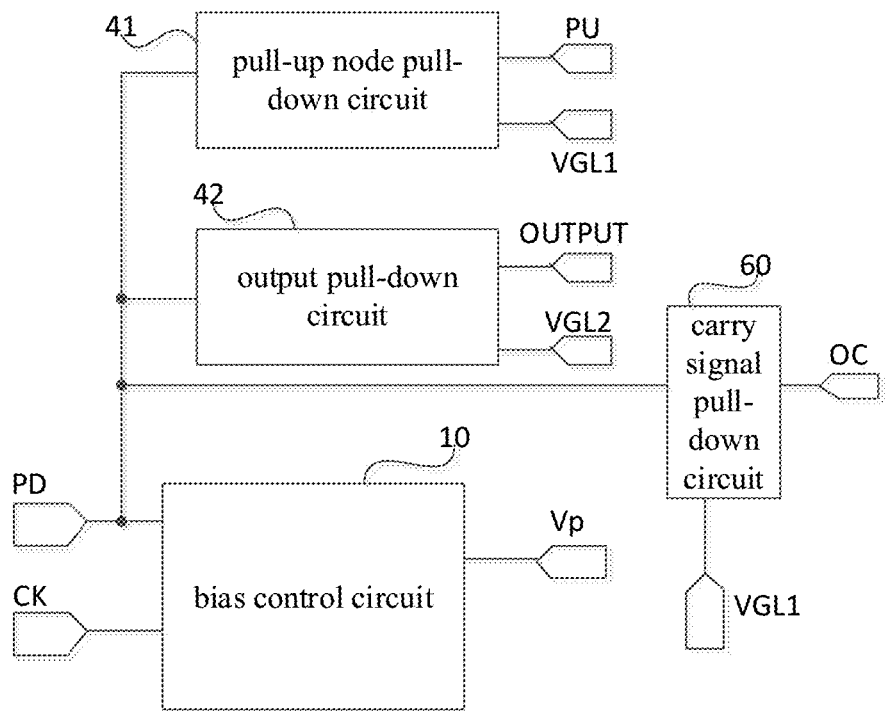
FIG. 6 is still yet another structural diagram of a shift register unit according to an embodiment of the present disclosure.

As shown in FIG. 6, based on the shift register unit shown in FIG. 4, the shift register unit according to the embodiment of the present disclosure may include a carry signal pull-down circuit 60.

The carry signal pull-down circuit 60 is electrically connected to the pull-down node PD, the carry signal output terminal OC, and the first low voltage terminal, respectively, is used to control the carry signal output terminal OC to receive the first low voltage VGL1 under the control of the potential of the pull-down node PD; the first low voltage terminal is used to provide the first low voltage VGL1.

Specifically, the carry signal pull-down circuit may include a carry signal pull-down transistor. A control electrode of the carry signal pull-down transistor is electrically connected to the pull-down node, a first electrode of the carry signal pull-down transistor is electrically connected to the carry signal output terminal, and a second electrode of the carry signal pull-down transistor is electrically connected to the third voltage terminal.

In a specific implementation, the carry signal pull-down transistor is an n-type transistor, and the voltage value of the bias voltage signal is less than the third voltage. Or, the carry signal pull-down transistor is a p-type transistor, and the voltage value of the bias voltage signal is greater than the third voltage. The third voltage terminal is used to input a third voltage signal, and the voltage value of the third voltage signal is the third voltage.

Figure 7:
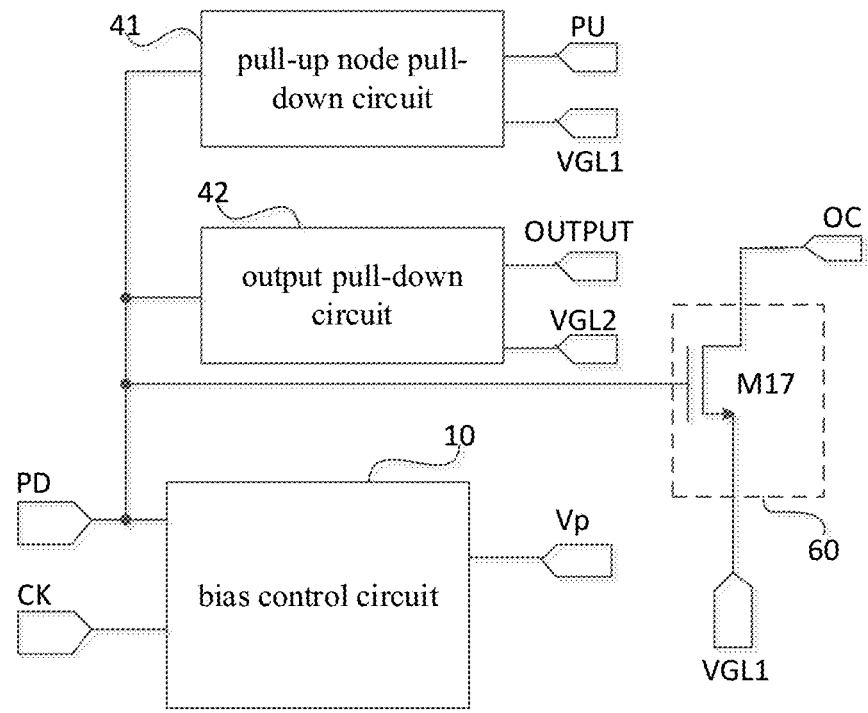
FIG. 7 is still yet another structural diagram of a shift register unit according to an embodiment of the present disclosure.

As shown in FIG. 7, based on the shift register unit shown in FIG. 6, the carry signal pull-down circuit 60 may include a carry signal pull-down transistor M17. A gate electrode of the carry signal pull-down transistor M17 is electrically connected to the pull-down node PD, a drain electrode of the carry signal pull-down transistor M17 is electrically connected to the carry signal output terminal OC, and a source electrode of the carry signal pull-down transistor M17 receives the first low voltage VGL1.

In the embodiment of the shift register unit shown in FIG. 7, M17 is an n-type thin film transistor, but it is not limited to this.

In the embodiment of the shift register unit shown in FIG. 7, when the bias voltage signal is the third low voltage signal and the potential of the third low voltage signal is the third low voltage VGL3, VGL3 is less than VGL2, so that when the bias control circuit 10 controls the connection between the pull-down node PD and the bias voltage terminal Vp, M17 is in a reverse bias state, so as to improve the threshold voltage drift of M17.

Specifically, the pull-down node may include a first pull-down node and a second pull-down node; the control clock signal terminal may include a first control clock signal terminal and a second control clock signal terminal; the bias voltage terminal may include a first bias voltage terminal and a second bias voltage terminal.

The bias control circuit includes a first bias control transistor and a second bias control transistor.

A control electrode of the first bias control transistor is electrically connected to the first control clock signal terminal, a first electrode of the first bias control transistor is electrically connected to the first pull-down node, and a second electrode of the first bias control transistor is electrically connected to the first bias voltage terminal.

A control electrode of the second bias control transistor is electrically connected to the second control clock signal terminal, a first electrode of the second bias control transistor is electrically connected to the second pull-down node, and a second electrode of the second bias control transistor is electrically connected to the second pull-down node.

In a specific implementation, the shift register unit described in the disclosed embodiment of the present disclosure may adopt two pull-down nodes, a first pull-down node and a second pull-down node. At this time, the control clock signal includes a first control clock signal terminal and a second control clock signal terminal. The bias control circuit includes a first bias control transistor and a second bias control transistor. The first bias control transistor controls the first pull-down node to receive the first bias voltage under the control of the first control clock signal. The second bias control transistor controls the second pull-down node to receive the second bias voltage under the control of the second control clock signal. In actual operation, the first bias voltage may be equal to the second bias voltage, or the first bias voltage may not be equal to the second bias voltage.

In addition, in the embodiment of the present disclosure, the first control clock signal provided by the first control clock signal terminal and the second control clock signal provided by the second control clock signal terminal may be inverted in phase, but not limited to this.

Figure 8:
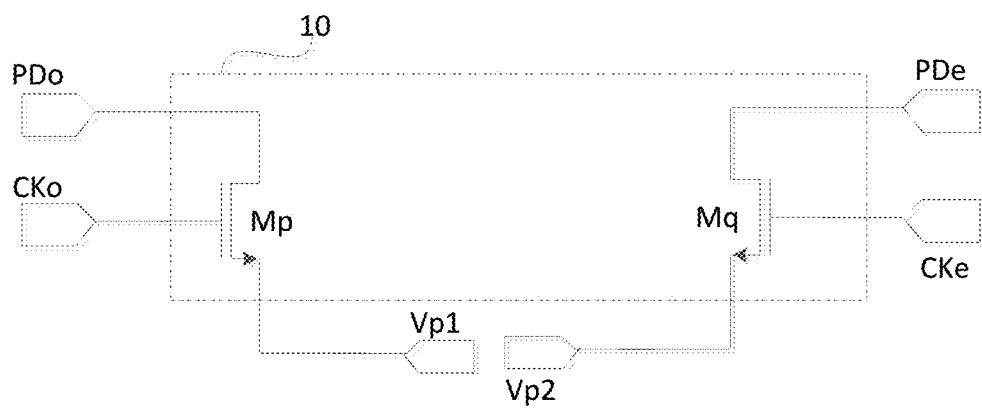
FIG. 8 is another circuit diagram of a shift register unit according to an embodiment of the present disclosure.

As shown in FIG. 8, based on the shift register unit shown in FIG. 1, the bias control circuit 10 includes a first bias control transistor Mp and a second bias control transistor Mq.

A gate electrode of the first bias control transistor Mp is electrically connected to the first control clock signal terminal CKo, and a source electrode of the first bias control transistor Mp is electrically connected to the first pull-down node PDo, and a drain electrode of the first bias control transistor Mp is electrically connected to the first bias voltage terminal Vp1.

A gate electrode of the second bias control transistor Mq is electrically connected to the second control clock signal terminal CKe, a source electrode of the second bias control transistor Mq is electrically connected to the second pull-down node PDe, and a drain electrode of the second bias control transistor Mq is electrically connected to the second bias voltage terminal Vp2.

In the embodiment shown in FIG. 8, Mp and Mq are n-type thin film transistors, but not limited thereto.

In the embodiment shown in FIG. 8, the second control clock signal provided by CKe may be the first control voltage VDDo, and the first control clock signal provided by CKo may be the second control voltage VDDe, but is not limited to this.

Specifically, the shift register unit according to the disclosed embodiment of the present disclosure may further include a pull-up node pull-down circuit and an output pull-down circuit.

The pull-up node pull-down circuit is electrically connected to the first pull-down node, the second pull-down node, the pull-up node and the first voltage terminal, respectively, and is used to control the connection between the pull-up node and the first voltage terminal under the control of the potential of the first pull-down node and the potential of the second pull-down node.

The output pull-down circuit is electrically connected to the first pull-down node, the second pull-down node, the gate driving signal output terminal, and the second voltage terminal, respectively, and is used to control the connection between the gate driving signal output terminal and the second voltage terminal under the control of the potential of the first pull-down node and the potential of the second pull-down node.

In specific implementation, when the shift register unit described in the disclosed embodiment of the present disclosure adopts two pull-down nodes, the shift register unit described in the disclosed embodiment of the present disclosure may include a pull-up node pull-down circuit and an output pull-down circuit. The pull-up node pull-down circuit controls the potential of the pull-up node under the control of the potential of the first pull-down node and the potential of the second pull-down node. The output pull-down circuit controls the gate driving signal outputted by the gate driving signal output terminal under the control of the potential of the first pull-down node and the potential of the second pull-down node.

In the disclosed embodiment of the present disclosure, the first voltage terminal may be a first low voltage terminal, and the second voltage terminal may be a second low voltage terminal, but it is not limited to this.

Figure 9:
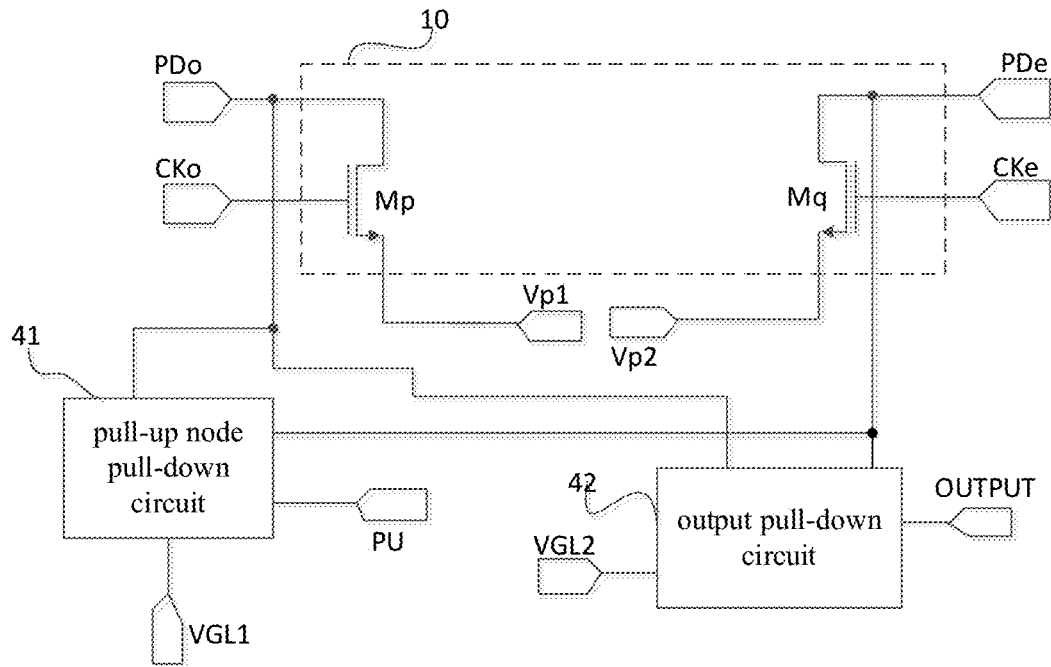
FIG. 9 is still yet another structural diagram of a shift register unit according to an embodiment of the present disclosure.

As shown in FIG. 9, based on the shift register unit shown in FIG. 8, the shift register unit according to the embodiment of the present disclosure may further include a pull-up node pull-down circuit 41 and an output pull-down circuit 42.

The pull-up node pull-down circuit 41 is electrically connected to the first pull-down node PDo, the second pull-down node PDe, the pull-up node PU, and the first low voltage terminal, respectively, and is configured to control the pull-up node PU to receive the first low voltage under the control of the potential of the first pull-down node PDo and the potential of the second pull-down node PDe; the first low voltage terminal is used to provide the first low voltage VGL1.

The output pull-down circuit 42 is electrically connected to the first pull-down node PDo, the second pull-down node PDe, the gate driving signal output terminal OUTPUT, and the second low voltage terminal, respectively, is configured to control the gate driving signal output terminal OUTPUT to receive the second low voltage VGL2 under the control of the potential of the first pull-down node PDo and the potential of the second pull-down node PDe; the second low voltage terminal is used to provide a second low voltage VGL2.

In the embodiment of the shift register unit shown in FIG. 9, the pull-up node pull-down circuit 41 controls to reset the potential of the pull-up node PU under the control of the potential of the first pull-down node PDo and the potential of the second pull-down node PDe, and the output pull-down circuit 42 controls to reset the gate driving signal outputted by the gate driving signal output terminal OUTPUT under the control of the potential of the first pull-down node PDo and the potential of the second pull-down node PDe.

Specifically, the pull-up node pull-down circuit may include a first pull-up node pull-down transistor and a second pull-up node pull-down transistor, and the output pull-down circuit may include a first output pull-down transistor and a second output pull-down transistor.

A control electrode of the first pull-up node pull-down transistor is electrically connected to the first pull-down node, a first electrode of the first pull-up node pull-down transistor is electrically connected to the pull-up node, and a second electrode of the first pull-up node pull-down transistor is electrically connected to the first voltage terminal.

A control electrode of the second pull-up node pull-down transistor is electrically connected to the second pull-down node, a first electrode of the second pull-up node pull-down transistor is electrically connected to the pull-up node, and a second electrode of the second pull-up node pull-down transistor is electrically connected to the first voltage terminal.

A control electrode of the first output pull-down transistor is electrically connected to the first pull-down node, a first electrode of the first output pull-down transistor is electrically connected to the gate driving signal output terminal, and a second electrode of the first output pull-down transistor is electrically connected to the second voltage terminal.

A control electrode of the second output pull-down transistor is electrically connected to the second pull-down node, a first electrode of the second output pull-down transistor is electrically connected to the gate driving signal output terminal, and a second electrode of the second output pull-down transistor is electrically connected to the second voltage terminal.

In specific implementation, the first pull-up node pull-down transistor, the second pull-up node pull-down transistor, the first output pull-down transistor, and the second output pull-down transistor are all n-type transistors, and the voltage value of the bias voltage signal is less than the first voltage, and the voltage value of the bias voltage signal is less than the second voltage.

Alternatively, the first pull-up node pull-down transistor, the second pull-up node pull-down transistor, the first output pull-down transistor, and the second output pull-down transistor are all p-type transistors, and the voltage value of the bias voltage signal is greater than the first voltage, the voltage value of the bias voltage signal is greater than the second voltage.

The first voltage terminal is used to input a first voltage signal, the voltage value of the first voltage signal is the first voltage; the second voltage terminal is used to input a second voltage signal, the voltage vale of the second voltage signal is the second voltage.

In the embodiment of the present disclosure, the first voltage terminal may be a first low voltage terminal, and the second voltage terminal may be a second low voltage terminal, but it is not limited to this.

In a specific implementation, the bias voltage signal may be a third low voltage signal, and the potential of the third low voltage signal is a third low voltage, but it is not limited to this.

Figure 10:
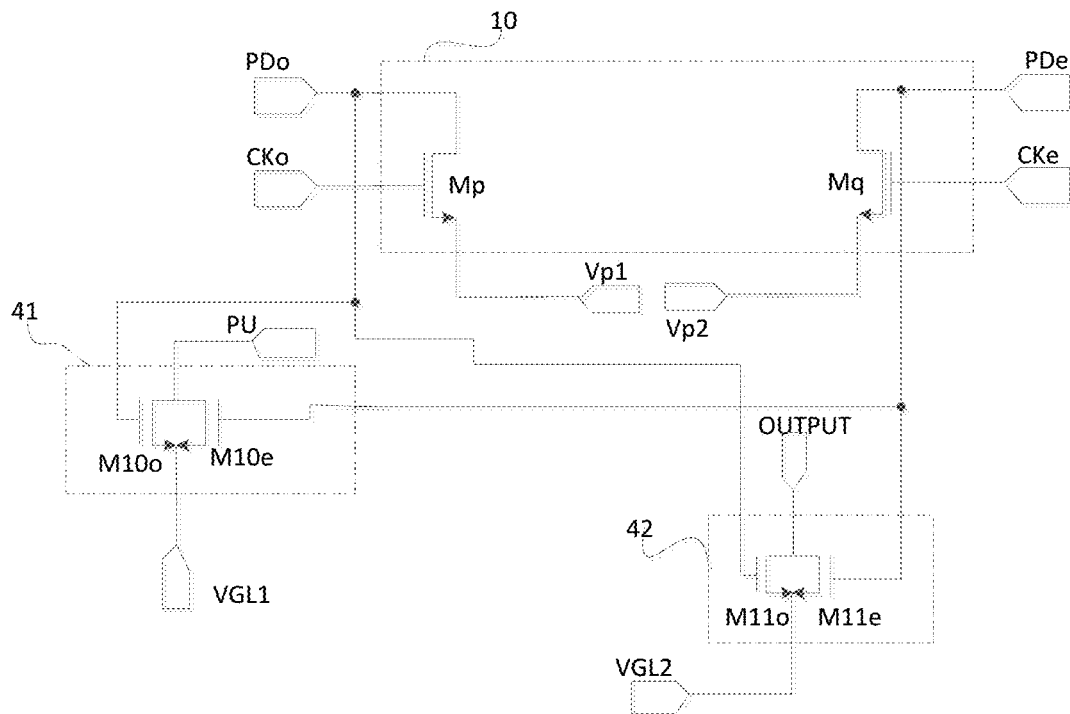
FIG. 10 is still yet another structural diagram of a shift register unit according to an embodiment of the present disclosure.

As shown in FIG. 10, based on the shift register unit shown in FIG. 9, the pull-up node pull-down circuit 41 may include a first pull-up node pull-down transistor M10*o* and a second pull-up node pull-down transistor M10*e*. The output pull-down circuit 42 may include a first output pull-down transistor M11*o* and a second output pull-down transistor M11*e*.

A gate electrode of the first pull-up node pull-down transistor M10*o* is electrically connected to the first pull-down node PDo, and a drain electrode of the first pull-up node pull-down transistor M10*o* is electrically connected to the pull-up node PU. A source electrode of the first pull-up node pull-down transistor M10*o* is connected to the first low voltage VGL1.

A gate electrode of the second pull-up node pull-down transistor M10*e* is electrically connected to the second pull-down node PDe, and a drain electrode of the second pull-up node pull-down transistor M10*e* is electrically connected to the pull-up node PU. A source electrode of the second pull-up node pull-down transistor M10*e* is connected to the first low voltage VGL1.

A gate electrode of the first output pull-down transistor M11*o* is electrically connected to the first pull-down node PDo, a drain electrode of the first output pull-down transistor M11*o* is electrically connected to the gate driving signal output terminal OUTPUT, and a source electrode of the first output pull-down transistor M11*o* is connected to the second low voltage VGL2.

A gate electrode of the second output pull-down transistor M11e is electrically connected to the second pull-down node PDe, a drain electrode of the second output pull-down transistor M11e is electrically connected to the gate driving signal output terminal OUTPUT, and a source electrode of the second output pull-down transistor M11e is connected to the second low voltage VGL2.

In the embodiment of the shift register unit shown in FIG. 10, M10o, M10e, M11o and M11e are all n-type thin film transistors, but not limited to this.

In the embodiment of the shift register unit shown in FIG. 10, VGL3 may be smaller than VGL1, and VGL3 may be smaller than VGL2, but it is not limited to this.

When the shift register unit shown in FIG. 10 is in operation, the following is implemented.

When the potential of PDo is a high level, the potential of PDe is a low level. At this time, the potential of CK is a high level, the potential of CKo is a low level, Mp is turned off, and Mq is turned on, so that the potential of PDe is VGL3, the gate-source voltage of M11e and the gate-source voltage of M10e are less than 0, so that M11e and M10e are in a reverse bias state; at this time, M11o and M10o are turned on, which will cause the threshold voltage of M11o and the threshold voltage of M10o to drift positively.

When the potential of PDo is a low level, the potential of PDe is a high level, the potential of CK is a low level, the potential of CKo is a high level, Mp is turned on, and Mq is turned off, so that the potential of PDo is VGL3, the gate-source voltage of M11o and the gate-source voltage of M10o are less than 0, so that M11o and M10o are in a reverse bias state; at this time, M11e and M10e are turned on, which will cause the threshold voltage of M11e and the threshold voltage of M10e to drift positively.

In the disclosed embodiment of the present disclosure, a display time period may include a plurality of display times, and each display time may include a first display period and a second display period that are set in sequence.

In the first display period, the potential of PDo is a high voltage, and the potential of PDe is a low voltage.

In the second display period, the potential of PDo is low voltage, and the potential of PDo is high voltage.

The duration of the first display period may be greater than or equal to 2 seconds and less than or equal to 3 seconds, and the duration of the second display period may be greater than or equal to 2 seconds and less than or equal to 3 seconds, but not Limited.

Specifically, the shift register unit disclosed in the present disclosure may further include a carry signal pull-down circuit.

The carry signal pull-down circuit is electrically connected to the first pull-down node, the second pull-down node, the carry signal output terminal, and the third voltage terminal, and is used to control the connection between the carry signal output terminal and the third voltage terminal under the control of the potential of the first pull-down node and the potential of the second pull-down node.

In the disclosed embodiments of the present disclosure, the third voltage terminal may be the first low voltage terminal, but not limited thereto.

Figure 11:
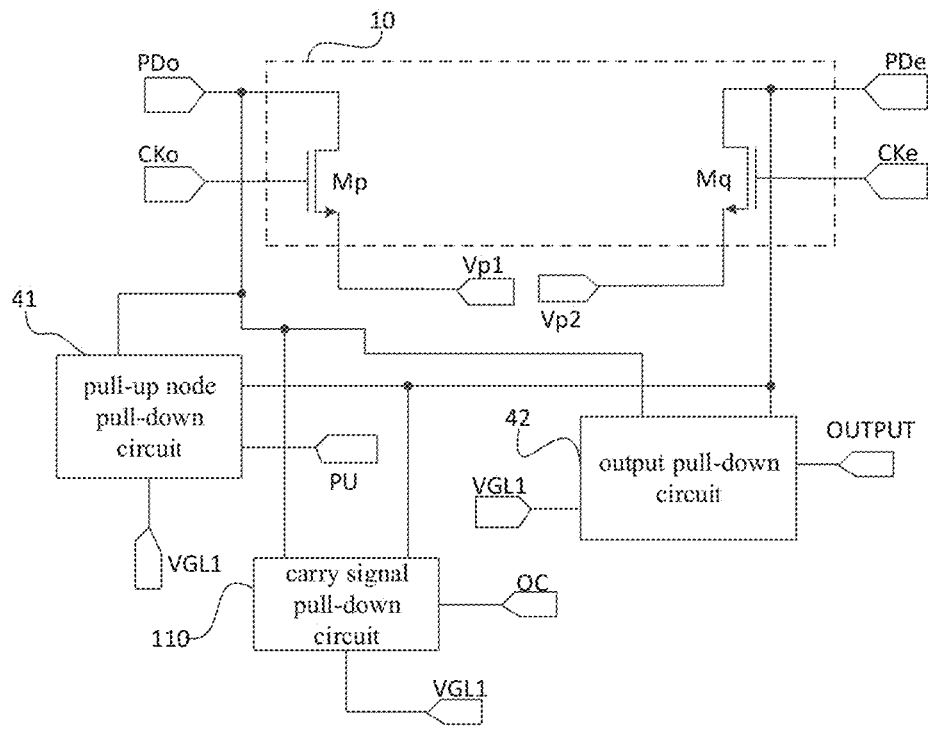
FIG. 11 is still yet another structural diagram of a shift register unit according to an embodiment of the present disclosure.

On the basis of the shift register unit shown in FIG. 9, as shown in FIG. 11, the shift register unit according to the disclosed embodiment of the present disclosure may further include a carry signal pull-down circuit 110.

The carry signal pull-down circuit 110 is electrically connected to the first pull-down node PDo, the second pull-down node PDe, the carry signal output terminal OC, and the first low voltage terminal, respectively, and is used to control the carry signal output terminal OC to receive the first low voltage VGL1 under the control of the potential of the first pull-down node PDo and the potential of the second pull-down node PDe.

In specific implementation, the shift register unit described in the disclosed embodiment of the present disclosure may further include a carry signal pull-down circuit 110, and the carry signal pull-down circuit 110 controls to reset the carry signal outputted by the carry signal output terminal OC under the control of the potential of the first pull-down node PDo and the potential of the second pull-down node PDe.

Specifically, the carry signal pull-down circuit may include a first carry signal pull-down transistor and a second carry signal pull-down transistor.

A control electrode of the first carry signal pull-down transistor is electrically connected to the first pull-down node, a first electrode of the first carry signal pull-down transistor is electrically connected to the carry signal output terminal, and a second electrode of the first carry signal pull-down transistor is electrically connected to the third voltage terminal.

A control electrode of the second carry signal pull-down transistor is electrically connected to the second pull-down node, a first electrode of the second carry signal pull-down transistor is electrically connected to the carry signal output terminal, and a second electrode of the second carry signal pull-down transistor is electrically connected to the third voltage terminal.

In specific implementation, both the first carry signal pull-down transistor and the second carry signal pull-down transistor are n-type transistors, and the voltage value of the bias voltage signal is less than the third voltage.

Alternatively, the first carry signal pull-down transistor and the second carry signal pull-down transistor are both p-type transistors, and the voltage value of the bias voltage signal is greater than the third voltage.

The third voltage terminal is used to input a third voltage signal, and the voltage value of the third voltage signal is the third voltage.

Specifically, the shift register unit described in the present disclosure may further include a first pull-down node control circuit and a second pull-down node control circuit.

The first pull-down node control circuit is electrically connected to a first control voltage terminal, a pull-up node, the first pull-down node, and a fourth voltage terminal, respectively, and is configured to control the potential of the first pull-down node under the control of the first control voltage provided by the first control voltage terminal and the potential of the pull-up node.

The second pull-down node control circuit is electrically connected to a second control voltage terminal, a pull-up node, the second pull-down node, and a fourth voltage terminal, respectively, is configured to control the potential of the second pull-down node under the control of a second control voltage provided by the second control voltage terminal and the potential of the pull-up node.

The first control clock signal terminal is the second control voltage terminal, and the second control clock signal terminal is the first control voltage terminal.

In specific implementation, the fourth voltage terminal may be the first voltage terminal, but not limited thereto.

In a specific implementation, the shift register unit disclosed in the present disclosure may further include a first pull-down node control circuit and a second pull-down node control circuit. The first pull-down node control circuit controls the potential of the first pull-down node under the control of the first control voltage and the potential of the pull-up node. The second pull-down node control circuit controls the potential of the second pull-down node under the control of the second control voltage and the potential of the pull-up node.

In the disclosed embodiment of the present disclosure, the first control clock signal terminal may be a second control voltage terminal, and the second control clock signal terminal may be a first control voltage terminal, but is not limited to this.

Figure 12:
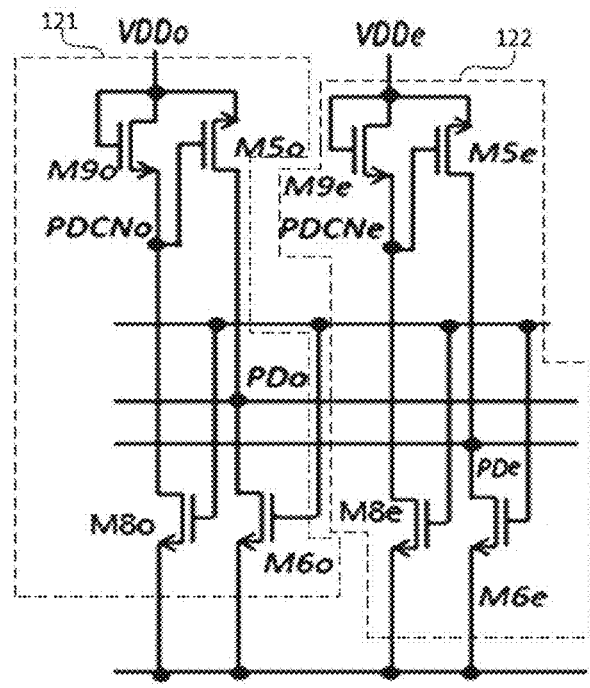
FIG. 12 is a circuit diagram of a first pull-down node control circuit 121 and a second pull-down node control circuit 122 according to an embodiment of the present disclosure.

In a specific implementation, as shown in FIG. 12, the first pull-down node control circuit 121 may include a first pull-down node control transistor M9o, a second pull-down node control transistor M8o, a third pull-down node control transistor M5o, and a fourth pull-down node Control transistor M6o.

Both the gate electrode of M9O and the drain electrode of M9O are connected to the first control voltage VDDo, and the source electrode of M9O is electrically connected to the first pull-down control node PDCNo.

The gate electrode of M8o is electrically connected to the pull-up node PU, the drain electrode of M8o is electrically connected to the first pull-down control node PDCNo, and the source electrode of M8o is connected to the first low voltage VGL1.

The gate electrode of M5o is electrically connected to the first pull-down control node PDCNo, the source electrode of M5o is connected to the first control voltage VDDo, and the drain electrode of M5o is electrically connected to the first pull-down node PDo.

The gate electrode of M6o is electrically connected to the pull-up node PU, the drain electrode of M6o is electrically connected to the first pull-down node PDo, and the source electrode of M6o is connected to the first low voltage VGL1.

The second pull-down node control circuit 122 may include a fifth pull-down node control transistor M9e, a sixth pull-down node control transistor M8e, a seventh pull-down node control transistor M5e, and an eighth pull-down node control transistor M6e.

Both the gate electrode of M9e and the drain electrode of M9e are connected to the second control voltage VDDe, and the source electrode of M9e is electrically connected to the second pull-down control node PDCNe.

The gate electrode of M8e is electrically connected to the pull-up node PU, the drain electrode of M8e is electrically connected to the second pull-down control node PDCNe, and the source electrode of M8e is connected to the first low voltage VGL1.

The gate electrode of M5e is electrically connected to the second pull-down control node PDCNe, the source electrode of M5e is connected to the second control voltage VDDe, and the drain electrode of M5e is electrically connected to the second pull-down node PDe.

The gate electrode of M6e is electrically connected to the pull-up node PU, the drain electrode of M6e is electrically connected to the second pull-down node PDe, and the source electrode of M6e is connected to the first low voltage VGL1.

In the first pull-down node control circuit 121 and the second pull-down node control circuit 122 shown in FIG. 12, each transistor is an n-type thin film transistor, but it is not limited thereto.

In the embodiment shown in FIG. 12, the width to length ratio of M8o is greater than that of M9o, the width to length ratio of M6o is greater than that of M5o, the width to length ratio of M8e is greater than that of M9e, and the width to length ratio of M6e is larger than that of M5e, but not limited to this.

Specifically, the shift register unit according to the embodiment of the present disclosure may further include a pull-up node control circuit and a gate driving output circuit.

The pull-up node control circuit is used to control the potential of the pull-up node.

The gate driving output circuit is used to control the gate driving signal outputted by the gate driving signal output terminal under the control of the potential of the pull-up node.

In specific implementation, the pull-up node control circuit may include an input transistor, a reset transistor, and a start transistor.

A control electrode of the input transistor and a first electrode of the input transistor are electrically connected to the input terminal, and a second electrode of the input transistor is electrically connected to the pull-up node.

A control electrode of the reset transistor is electrically connected to the reset terminal, a first electrode of the reset transistor is electrically connected to the pull-up node, and a second electrode of the reset transistor is connected to a first low voltage.

A control electrode of the starting transistor is electrically connected to a starting terminal, a first electrode of the starting transistor is electrically connected to the pull-up node, and a second electrode of the starting transistor is connected to the first low voltage.

The gate driving output circuit includes an output transistor and a storage capacitor.

A control electrode of the output transistor is electrically connected to the pull-up node, a first electrode of the output transistor is electrically connected to the first clock signal terminal, and a second electrode of the output transistor is electrically connected to the gate driving signal output terminal. The first clock signal terminal is used to provide a first clock signal.

A first end of the storage capacitor is electrically connected to the pull-up node, and a second end of the storage capacitor is electrically connected to the gate driving signal output end.

In the disclosed embodiment of the present disclosure, the input terminal may be electrically connected to the driving signal output terminal in an adjacent previous stage or the carry signal output terminal in the adjacent previous stage, and the reset terminal may be connected to the gate driving signal output terminal in an adjacent next stage or the carry signal output terminal in the adjacent next stage, but not limited to this.

When the shift register unit according to the disclosed embodiment of the present disclosure further includes a carry signal output terminal, the shift register unit according to the disclosed embodiment of the present disclosure may further include a carry signal output circuit, and the carry signal output circuit is used to control the carry signal outputted by the carry signal output terminal under the control of the potential of the pull-up node.

Specifically, the carry signal output circuit may include a carry signal output transistor.

A control electrode of the carry signal output transistor is electrically connected to the pull-up node, a first electrode of the carry signal output transistor is electrically connected to the first clock signal terminal, and a second electrode of the carry signal output transistor is electrically connected to the carry signal output terminal.

The following specific embodiments are used to illustrate the shift register unit described in the present disclosure.

Figure 13:
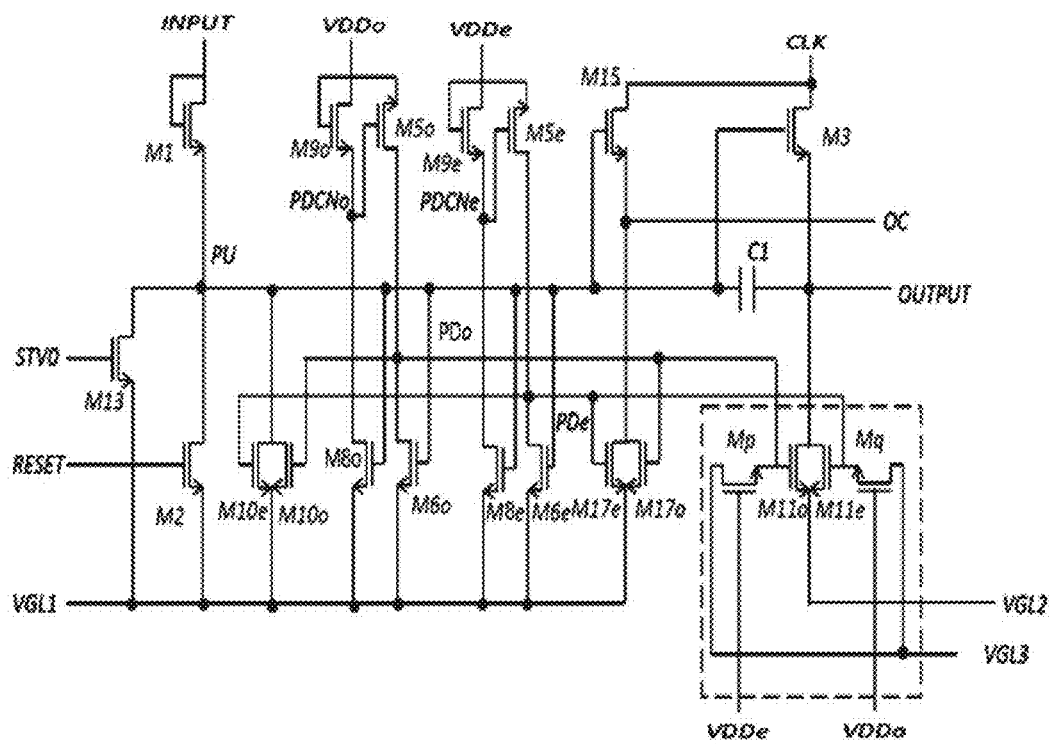
FIG. 13 is yet another circuit diagram of a specific embodiment of the shift register unit according to an embodiment of the present disclosure.

As shown in FIG. 13, a specific embodiment of the shift register unit disclosed in the present disclosure includes a pull-up node control circuit, a gate driving output circuit, a carry signal output circuit, a bias control circuit, a pull-up node pull-down circuit, an output pull-down circuit, a carry signal pull-down circuit, a first pull-down node control circuit, a second pull-down node control circuit, a pull-up node control circuit, a gate driving output circuit, and a carry signal output circuit.

The bias control circuit includes a first bias control transistor Mp and a second bias control transistor Mq.

A gate electrode of the first bias control transistor Mp is connected to the second control voltage VDDe, a source electrode of the first bias control transistor Mp is electrically connected to the first pull-down node PDo, and a drain electrode of the first bias control transistor is electrically connected to the first bias voltage terminal Vp1.

A gate electrode of the second bias control transistor Mq is connected to the first control voltage VDDo, a source electrode of the second bias control transistor Mq is electrically connected to the second pull-down node PDe, and a drain electrode of the second bias control transistor Mq is electrically connected to the second bias voltage terminal Vp2.

The pull-up node pull-down circuit includes a first pull-up node pull-down transistor M10o and a second pull-up node pull-down transistor M10e, and the output pull-down circuit may include a first output pull-down transistor M11o and a second output pull-down transistor M11e.

A gate electrode of the first pull-up node pull-down transistor M10o is electrically connected to the first pull-down node PDo, and a drain electrode of the first pull-up node pull-down transistor M10o is electrically connected to the pull-up node PU, and a source electrode of the first pull-up node pull-down transistor M10o is connected to the first low voltage VGL1.

A gate electrode of the second pull-up node pull-down transistor M10e is electrically connected to the second pull-down node PDe, and a drain electrode of the second pull-up node pull-down transistor M10e is electrically connected to the pull-up node PU, and a source electrode of the pull-up node pull-down transistor M10e is connected to the first low voltage VGL1.

A gate electrode of the first output pull-down transistor M11o is electrically connected to the first pull-down node PDo, a drain electrode of the first output pull-down transistor M11o is electrically connected to the gate driving signal output terminal OUTPUT, and a source electrode of the first output pull-down transistor M11o is connected to the second low voltage VGL2.

A gate electrode of the second output pull-down transistor M11e is electrically connected to the second pull-down node PDe, a drain electrode of the second output pull-down transistor M11e is electrically connected to the gate driving signal output terminal OUTPUT, and a source electrode of the second output pull-down transistor M11e is connected to the second low voltage VGL2.

The carry signal pull-down circuit includes a first carry signal pull-down transistor M17o and a second carry signal pull-down transistor M17e.

The gate electrode of the first carry signal pull-down transistor M17o is electrically connected to the first pull-down node PDo, the drain electrode of the first carry signal pull-down transistor M17o is electrically connected to the carry signal output terminal OC, and the source electrode of the first carry signal pull-down transistor M17o is connected to the first low voltage VGL1.

The gate electrode of the second carry signal pull-down transistor M17e is electrically connected to the second pull-down node PDe, the drain electrode of the second carry signal pull-down transistor M17e is electrically connected to the carry signal output terminal OC, and the source electrode of the second carry signal pull-down transistor M17e is connected to the first low voltage VGL1.

The first pull-down node control circuit includes a first pull-down node control transistor M9o, a second pull-down node control transistor M8o, a third pull-down node control transistor M5o, and a fourth pull-down node control transistor M6o.

The gate electrode of M9o and the drain electrode of M9o are both connected to the first control voltage VDDo, and the source electrode of M9o is electrically connected to the first pull-down control node PDCNo.

The gate electrode of M8o is electrically connected to the pull-up node PU, the drain electrode of M8o is electrically connected to the first pull-down control node PDCNo, and the source electrode of M8o is connected to the first low voltage VGL1.

The gate electrode of M5o is electrically connected to the first pull-down control node PDCNo, the source electrode of M5o is connected to the first control voltage VDDo, and the drain electrode of M5o is electrically connected to the first pull-down node PDo.

The gate electrode of M6o is electrically connected to the pull-up node PU, the drain electrode of M6o is electrically connected to the first pull-down node PDo, and the source electrode of M6o is connected to the first low voltage VGL1.

The second pull-down node control circuit includes a fifth pull-down node control transistor M9e, a sixth pull-down node control transistor M8e, a seventh pull-down node control transistor M5e, and an eighth pull-down node control transistor M6e.

The gate electrode of M9e and the drain electrode of M9e are both connected to the second control voltage VDDe, and the source electrode of M9e is electrically connected to the second pull-down control node PDCNe.

The gate electrode of M8e is electrically connected to the pull-up node PU, the drain electrode of M8e is electrically connected to the second pull-down control node PDCNe, and the source electrode of M8e is connected to the first low voltage VGL1.

The gate electrode of M5e is electrically connected to the second pull-down control node PDCNe, the source electrode of M5e is connected to the second control voltage VDDe, and the drain electrode of M5e is electrically connected to the second pull-down node PDe.

The gate electrode of M6e is electrically connected to the pull-up node PU, the drain electrode of M6e is electrically connected to the second pull-down node PDe, and the source electrode of M6e is connected to the first low voltage VGL1.

The pull-up node control circuit includes an input transistor M1, a reset transistor M2, and a start transistor M13.

The gate electrode of the input transistor M1 and the drain electrode of the input transistor M1 are electrically connected to the input terminal INPUT, and the source electrode of the input transistor M1 is electrically connected to the pull-up node PU.

The gate electrode of the reset transistor M2 is electrically connected to the reset terminal RESET, the drain electrode of the reset transistor M2 is electrically connected to the pull-up node PU, and the source electrode of the reset transistor M2 is connected to the first low voltage VGL1.

The gate electrode of the start transistor M13 is electrically connected to the start terminal STV0, the drain electrode of the start transistor M13 is electrically connected to the pull-up node PU, and the source electrode of the start transistor M13 is connected to the first low voltage VGL1.

The gate driving output circuit includes an output transistor M3 and a storage capacitor C1.

The gate electrode of the output transistor M3 is electrically connected to the pull-up node PU, the drain electrode of the output transistor M3 is electrically connected to the first clock signal terminal, and the source electrode of the output transistor M3 is electrically connected to the gate driving signal output terminal OUTPUT; the first clock signal terminal is used to provide a first clock signal CLK.

A first end of the storage capacitor C1 is electrically connected to the pull-up node PU, and a second end of the storage capacitor C1 is electrically connected to the gate driving signal output terminal OUTPUT.

The carry signal output circuit includes a carry signal output transistor M15.

The gate electrode of the carry signal output transistor M15 is electrically connected to the pull-up node PU, the drain electrode of the carry signal output transistor M15 is electrically connected to the first clock signal terminal, and the source electrode of the carry signal output transistor is electrically connected to the carry signal output terminal OC.

In the specific embodiment of the shift register unit shown in FIG. 13, all the transistors are n-type thin film transistors, but not limited to this.

In the embodiment of the shift register unit shown in FIG. 13, VGL3 is smaller than VGL1, and VGL3 is smaller than VGL2.

Figure 14:
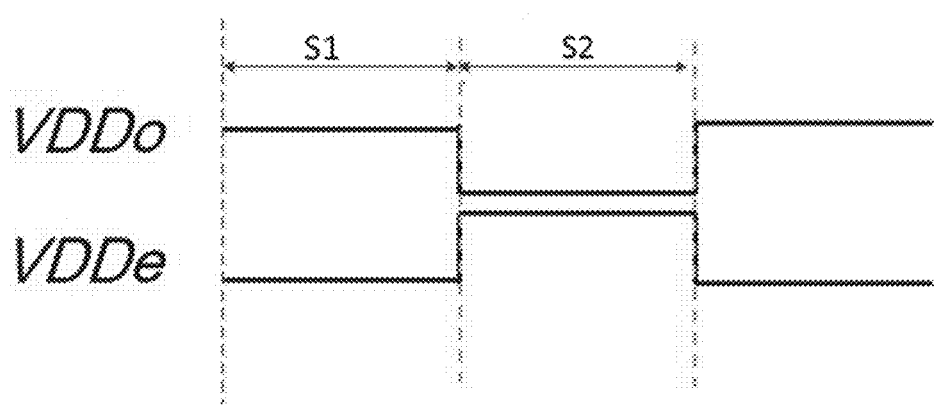
FIG. 14 is a timing diagram of VDDo and VDDe used in the shift register unit according to an embodiment of the present disclosure.

As shown in FIG. 14, VDDo and VDDe are inversed in phase.

In the first display period S1, VDDo is the high voltage VGH, and VDDe is the first low voltage VGL1; in the second display period S2, VDDo is the first low voltage VGL1, and VDDe is the high voltage VGH.

Figure 15:
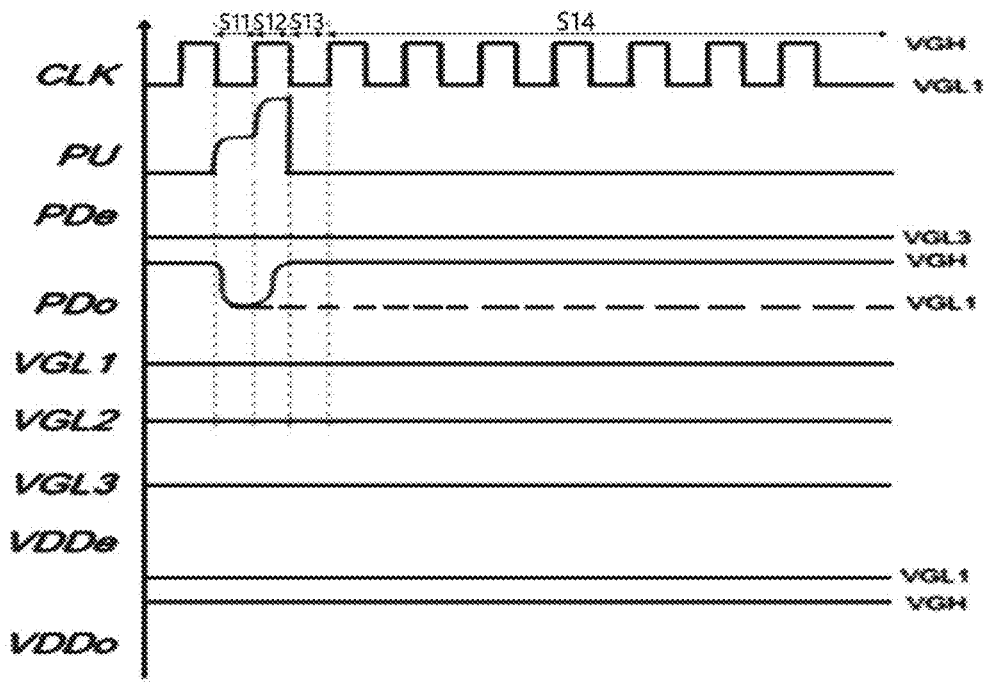
FIG. 15 is a time sequence diagram of the shift register unit in a first display period according to an embodiment of the present disclosure.

As shown in FIG. 15, the first display period includes a first input phase S11, a first output phase S12, a first reset phase S13, and a first output cut-off maintenance phase S14.

In the first display period, VDDo is the high voltage VGH, VDDe is the first low voltage VGL1, Mp is turned off, and Mq is turned on, so that the potential of PDe is VGL3. Since VGL3 is less than VGL1, VGL3 is less than VGL2, in the first display period S1, M10e, M11e and M17e are in a reverse bias state.

In the first input phase S11, INPUT inputs a high level, the potential of PU is pulled up, and the potential of PDo is pulled down; M3 and M15 are both turned on, and the potential of CLK is VGL1 at this time, then both OUTPUT and OC output VGL1.

In the first output phase S12, the potential of PU is pulled up by the bootstrap of C1, the potential of PDo is continuously pulled down, and both M3 and M15 are turned on. At this time, the potential of CLK is VGH, and both OUTPUT and OC output VGH.

In the first reset phase S13, RESET inputs a high level, M2 is turned on to pull the potential of PU down to VGL1, the potential of PDo is pulled up to VGH by VDDo, and M10o, M11o and M17o are all turned on to control OUTPUT to output VGL2, control OC to output VGL1, and further control the potential of PDo to VGL1.

In the first output cut-off maintenance phase S14, both INPUT and RESET input a low level, the potential of PU remains a low level, the potential of PDo is pulled up to VGH by VDDo, and M10o, M11o and M17o are all turned on to control OUTPUT to output VGL2, control OC to output VGL1, and further control the potential of PDo to VGL1.

Figure 16:
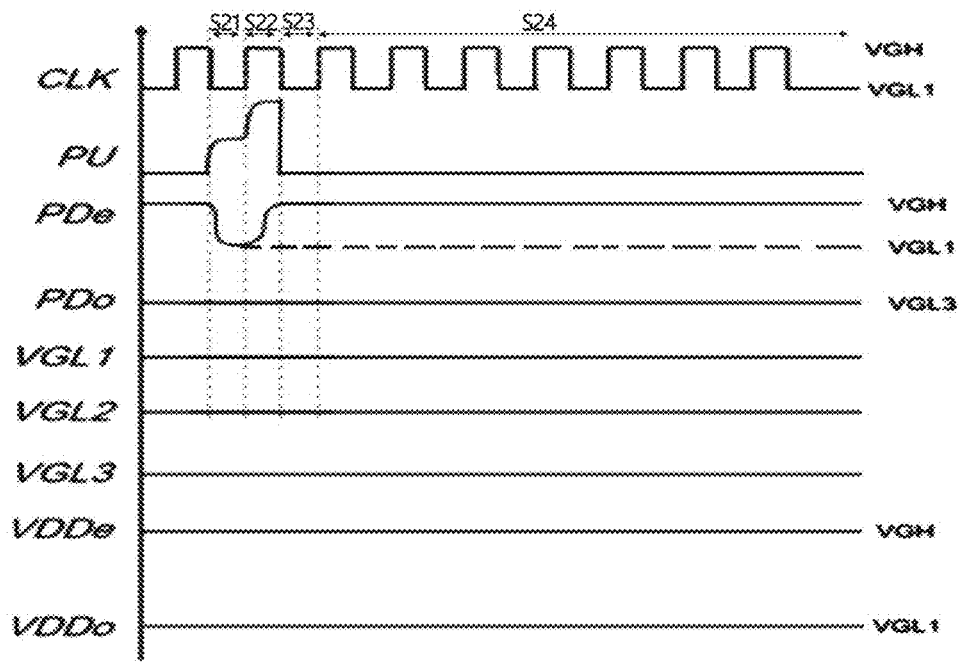
FIG. 16 is a time sequence diagram of the shift register unit in a second display period according to an embodiment of the present disclosure.

As shown in FIG. 16, the second display period includes a second input phase S21, a second output phase S22, a second reset phase S23, and a second output cut-off maintenance phase S24.

In the second display period, VDDe is the high voltage VGH, VDDo is the first low voltage VGL1, Mp is turned on, and Mq is turned off, so that the potential of PDo is VGL3. Since VGL3 is less than VGL1, VGL3 is less than VGL2, in the second display period S2, M10o, M11o and M17o are in reverse bias state.

In the second input phase S21, INPUT inputs a high level, the potential of PU is pulled up, and the potential of PDe is pulled down; M3 and M15 are both turned on, and the potential of CLK is VGL1 at this time, then both OUTPUT and OC output VGL1.

In the second output phase S22, the potential of PU is pulled up by the bootstrap of C1, the potential of PDe is continuously pulled down, and both M3 and M15 are turned on. At this time, the potential of CLK is VGH, and both OUTPUT and OC output VGH.

In the second reset phase S23, RESET inputs a high level, M2 is turned on to pull the potential of PU down to VGL1, and the potential of PDe is pulled up to VGH by VDDe. M10e, M11e and M17e are all turned on to control OUTPUT to output VGL2, control OC to output VGL1, and further control the potential of PDe to VGL1.

In the second output cut-off maintenance phase S24, INPUT and RESET both input a low level, the potential of PU is maintained at a low level, the potential of PDe is pulled up to VGH by VDDe, M10e, M11e and M17e are all turned on to control OUTPUT to output VGL2, control OC to output VGL1, and further control the potential of PDe to VGL1.

In working process of the shift register unit shown in FIG. 13, the following is implemented.

In the first display period S1, M10e, M11e, and M17e are in a reverse bias state, the gate-source voltage of M10e is equal to VGL3-VGL1, the gate-source voltage of M11e is equal to VGL3-VGL2, and the gate-source voltage of M17e is equal to VGL3-VGL1. Since VGL3 is smaller than VGL1 and VGL3 is smaller than VGL2, the gate-source voltage of M10e is smaller than the threshold voltage of M10e, the gate-source voltage of M11e is smaller than the threshold voltage of M11e, and the gate-source voltage of M17e is smaller than the threshold voltage of M17e, the threshold voltage of M10e, the threshold voltage of M11e and the threshold voltage of M17e are reversely compensated.

In the first reset phase S11 and the first output cut-off maintenance phase S12 included in the first display period S1, M10o, M11o and M17o are all turned on, so as to implement a normal noise reduction on PU, OC and OUTPUT.

In the second display period S2, M10o, M11o, and M17o are in a reverse bias state, the gate-source voltage of M10o is equal to VGL3-VGL1, the gate-source voltage of M11o is equal to VGL3-VGL2, and the gate-source voltage of M17o is equal to VGL3-VGL1. Since VGL3 is less than VGL1 and VGL3 is less than VGL2, the gate-source voltage of M10o is less than the threshold voltage of M10o, the gate-source voltage of M11o is less than the threshold voltage of M11o, and the gate-source voltage of M17o is less than the threshold voltage of M17o, the threshold voltage of M10o, the threshold voltage of M11o and the threshold voltage of M17o are reversely compensated.

In the second reset phase S21 and the second output cut-off maintenance phase S22 included in the second display period S2, M10e, M11e and M17e are all turned on, so as to implement a normal noise reduction on PU, OC and OUTPUT.

In this case, the threshold voltage of M11o, the threshold voltage of M11o, the threshold voltage of M17o, the threshold voltage of M11e, the threshold voltage of M11e, and the threshold voltage of M17e will not greatly drift.

Figure 17:
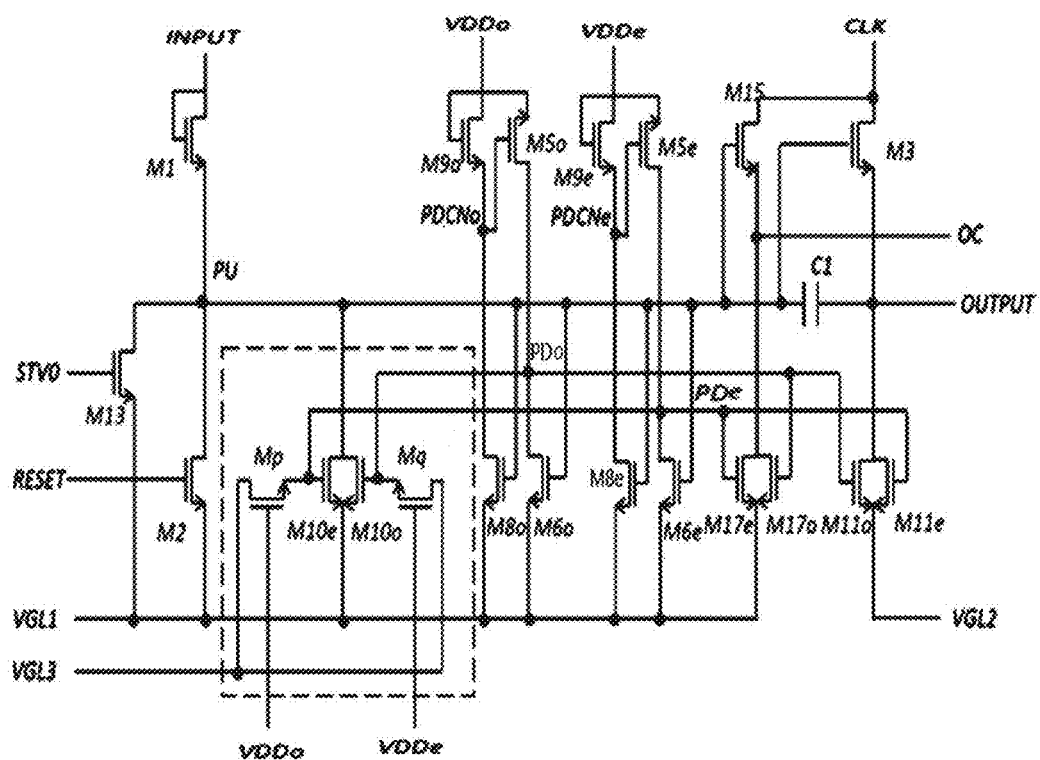
FIG. 17 is a circuit diagram of the shift register unit according to an embodiment of the present disclosure.

As shown in FIG. 17, the first bias control transistor Mp and the second bias control transistor Mq may be arranged close to M10o and M10e.

Figure 18:
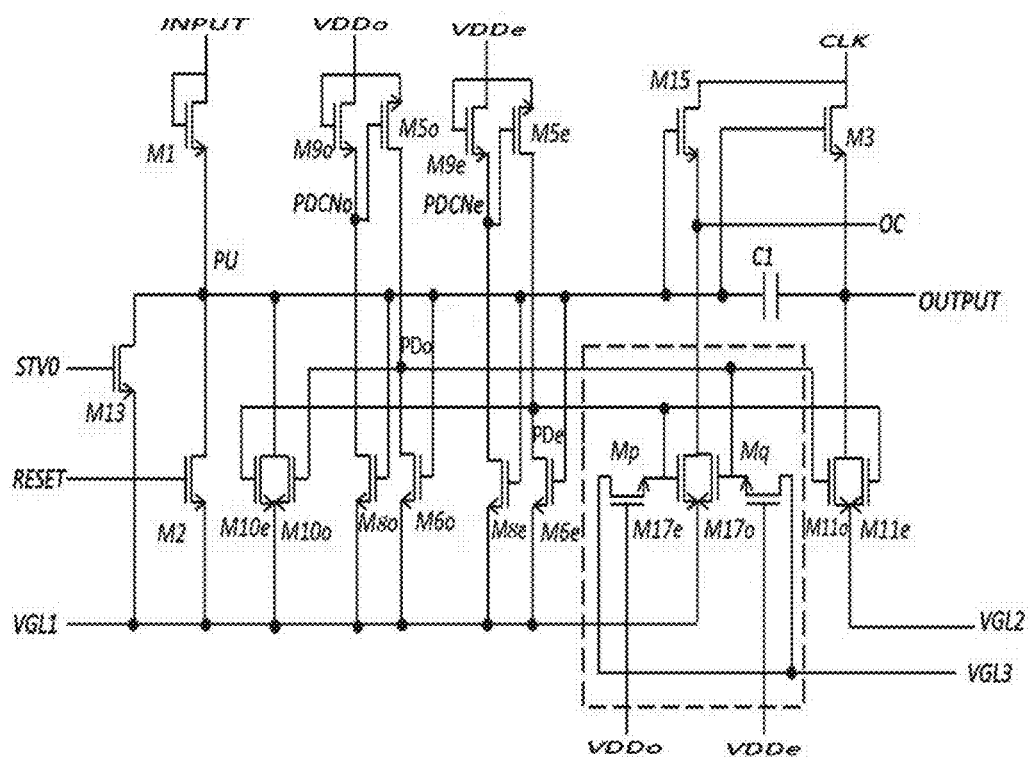
FIG. 18 is a circuit diagram of the shift register unit according to an embodiment of the present disclosure.

As shown in FIG. 18, the first bias control transistor Mp and the second bias control transistor Mq may be arranged close to M17o and M17e.

As shown in FIG. 17 and FIG. 18, compared with FIG. 13, the connection relationship between Mp and Mq is unchanged, and only the setting positions of Mp and Mq are changed.

The gate driving circuit according to the embodiment of the present disclosure includes a plurality of stages of the above-mentioned shift register units.

The disclosed embodiments of the present disclosure provide a new gate driving circuit, which can improve the abnormal display due to the threshold voltage drift of TFT (including amorphous silicon TFT and oxide TFT) in the gate driving circuit during the reliability process, and increase the service life of the gate driving circuit.

The display device according to the embodiment of the disclosure includes the above-mentioned gate driving circuit.

The display device provided by the disclosed embodiment of the present disclosure may be any product or component with display function, such as a mobile phone, a tablet computer, a television, a monitor, a notebook computer, a digital photo frame, a navigator, and the like.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A shift register unit, comprising:
a bias control circuit electrically connected to a pull-down node, a control clock signal terminal, and a bias voltage terminal, respectively, and the bias control circuit is configured to control connection between the pull-down node and the bias voltage terminal under the control of a control clock signal provided by the control clock signal terminal,
wherein a bias voltage signal is inputted by the bias voltage terminal,
wherein the pull-down node comprises a first pull-down node and a second pull-down node; the control clock signal terminal may include a first control clock signal terminal and a second control clock signal terminal; the bias voltage terminal comprises a first bias voltage terminal and a second bias voltage terminal,
wherein the bias control circuit comprises a first bias control transistor and a second bias control transistor,
wherein a control electrode of the first bias control transistor is electrically connected to the first control clock signal terminal, a first electrode of the first bias control transistor is electrically connected to the first pull-down node, and a second electrode of the first bias control transistor is electrically connected to the first bias voltage terminal, and
wherein a control electrode of the second bias control transistor is electrically connected to the second control clock signal terminal, a first electrode of the second bias control transistor is electrically connected to the second pull-down node, and a second electrode of the second bias control transistor is electrically connected to the second pull-down node.

2. The shift register unit according to claim 1, wherein the bias control circuit comprises a bias control transistor, and
wherein a control electrode of the bias control transistor is electrically connected to the control clock signal terminal, a first electrode of the bias control transistor is electrically connected to the pull-down node, and a second electrode of the bias control transistor is electrically connected to the bias voltage terminal.

3. The shift register unit according to claim 2, further comprising a pull-up node pull-down circuit and an output pull-down circuit,
wherein the pull-up node pull-down circuit is electrically connected to the pull-down node, the pull-up node, and the first voltage terminal, respectively, is configured to control connection between the pull-up node and the first voltage terminal under the control of the potential of the pull-down node, and
wherein the output pull-down circuit is electrically connected to the pull-down node, the gate driving signal output terminal, and the second voltage terminal, and is configured to control connection between the gate driving signal output terminal and the second voltage terminal under the control of the potential of the pull-down node.

4. The shift register unit according to claim 3, wherein the pull-up node pull-down circuit comprises a pull-up node pull-down transistor, and the output pull-down circuit comprises an output pull-down transistor,
wherein a control electrode of the pull-up node pull-down transistor is electrically connected to the pull-down node, a first electrode of the pull-up node pull-down transistor is electrically connected to the pull-up node, and a second electrode of the pull-up node pull-down transistor is electrically connected to the first voltage terminal, and
wherein a control electrode of the output pull-down transistor is electrically connected to the pull-down node, a first electrode of the output pull-down transistor is electrically connected to the gate driving signal output end, and a second electrode of the output pull-down transistor is electrically connected to the second voltage terminal.

5. The shift register unit according to claim 2, further comprising a carry signal pull-down circuit, wherein the carry signal pull-down circuit is electrically connected to the pull-down node, a carry signal output terminal, and the third voltage terminal, respectively, and is configured to control connection between the carry signal output terminal and the third voltage terminal under the control of the potential of the pull-down node.

6. The shift register unit according to claim 5, further comprising a carry signal pull-down circuit, wherein the carry signal pull-down circuit is electrically connected to the pull-down node, the carry signal output terminal, and the third voltage terminal, respectively, and is configured to control connection between the carry signal output terminal and the third voltage terminal under the control of the potential of the pull-down node.

7. The shift register unit according to claim 1, further comprising a pull-up node pull-down circuit and an output pull-down circuit,
wherein the pull-up node pull-down circuit is electrically connected to the first pull-down node, the second pull-down node, the pull-up node and the first voltage terminal, respectively, and is configured to control connection between the pull-up node and the first voltage terminal under the control of a potential of the first pull-down node and a potential of the second pull-down node, and
wherein the output pull-down circuit is electrically connected to the first pull-down node, the second pull-down node, the gate driving signal output terminal, and the second voltage terminal, respectively, and is configured to control connection between the gate driving signal output terminal and the second voltage terminal under the control of the potential of the first pull-down node and the potential of the second pull-down node.

8. The shift register unit according to claim 7, wherein the pull-up node pull-down circuit comprises a first pull-up node pull-down transistor and a second pull-up node pull-down transistor, and the output pull-down circuit comprises a first output pull-down transistor and a second output pull-down transistor,
wherein a control electrode of the first pull-up node pull-down transistor is electrically connected to the first pull-down node, a first electrode of the first pull-up node pull-down transistor is electrically connected to the pull-up node, and a second electrode of the first pull-up node pull-down transistor is electrically connected to the first voltage terminal,
wherein a control electrode of the second pull-up node pull-down transistor is electrically connected to the second pull-down node, a first electrode of the second pull-up node pull-down transistor is electrically connected to the pull-up node, and a second electrode of the second pull-up node pull-down transistor is electrically connected to the first voltage terminal,
wherein a control electrode of the first output pull-down transistor is electrically connected to the first pull-down node, a first electrode of the first output pull-down transistor is electrically connected to the gate driving signal output terminal, and a second electrode of the first output pull-down transistor is electrically connected to the second voltage terminal, and
wherein a control electrode of the second output pull-down transistor is electrically connected to the second pull-down node, a first electrode of the second output pull-down transistor is electrically connected to the gate driving signal output terminal, and a second electrode of the second output pull-down transistor is electrically connected to the second voltage terminal.

9. The shift register unit according to claim 1, further comprising a carry signal pull-down circuit, wherein the carry signal pull-down circuit is electrically connected to the first pull-down node, the second pull-down node, the carry signal output terminal, and the third voltage terminal, and is configured to control connection between the carry signal output terminal and the third voltage terminal under the control of the potential of the first pull-down node and the potential of the second pull-down node.

10. The shift register unit according to claim 9, wherein the carry signal pull-down circuit comprises a first carry signal pull-down transistor and a second carry signal pull-down transistor,
wherein a control electrode of the first carry signal pull-down transistor is electrically connected to the first pull-down node, a first electrode of the first carry signal pull-down transistor is electrically connected to the carry signal output terminal, and a second electrode of the first carry signal pull-down transistor is electrically connected to the third voltage terminal, and
wherein a control electrode of the second carry signal pull-down transistor is electrically connected to the second pull-down node, a first electrode of the second carry signal pull-down transistor is electrically connected to the carry signal output terminal, and a second electrode of the second carry signal pull-down transistor is electrically connected to the third voltage terminal.

11. The shift register unit according to claim 1, further comprising a first pull-down node control circuit and a second pull-down node control circuit,
wherein the first pull-down node control circuit is electrically connected to a first control voltage terminal, the pull-up node, the first pull-down node, and a fourth voltage terminal, respectively, and is configured to control the potential of the first pull-down node under the control of the first control voltage provided by the first control voltage terminal and the potential of the pull-up node,
wherein the second pull-down node control circuit is electrically connected to a second control voltage terminal, the pull-up node, the second pull-down node, and a fourth voltage terminal, respectively, is configured to control the potential of the second pull-down node under the control of a second control voltage provided by the second control voltage terminal and the potential of the pull-up node, and
wherein the first control clock signal terminal is the second control voltage terminal, and the second control clock signal terminal is the first control voltage terminal.

12. The shift register unit according to claim 1, further comprising a pull-up node control circuit and a gate driving output circuit,
wherein the pull-up node control circuit is configured to control the potential of the pull-up node, and
wherein the gate driving output circuit is configured to control the gate driving signal outputted by the gate driving signal output terminal under the control of the potential of the pull-up node.

13. The shift register unit according to claim 12, wherein the pull-up node control circuit comprises an input transistor, a reset transistor, and a start transistor,
wherein a control electrode of the input transistor and a first electrode of the input transistor are electrically connected to the input terminal, and a second electrode of the input transistor is electrically connected to the pull-up node,
wherein a control electrode of the reset transistor is electrically connected to the reset terminal, a first electrode of the reset transistor is electrically connected to the pull-up node, and a second electrode of the reset transistor is connected to a first low voltage,
wherein a control electrode of the starting transistor is electrically connected to a starting terminal, a first electrode of the starting transistor is electrically connected to the pull-up node, and a second electrode of the starting transistor is connected to the first low voltage, wherein the gate driving output circuit comprises an output transistor and a storage capacitor, wherein a control electrode of the output transistor is electrically connected to the pull-up node, a first electrode of the output transistor is electrically connected to the first clock signal terminal, and a second electrode of the output transistor is electrically connected to the gate driving signal output terminal, the first clock signal terminal is used to provide a first clock signal, and wherein a first end of the storage capacitor is electrically connected to the pull-up node, and a second end of the storage capacitor is electrically connected to the gate driving signal output end.

14. The shift register unit according to claim 13, wherein the input terminal is electrically connected to the driving signal output terminal in an adjacent previous stage or the carry signal output terminal in an adjacent previous stage, and the reset terminal is connected to the gate driving signal output terminal in an adjacent next stage or the carry signal output terminal in the adjacent next stage.

15. The shift register unit according to claim 12, further comprising a carry signal output circuit, wherein the carry signal output circuit is configured to control the carry signal outputted by the carry signal output terminal under the control of the potential of the pull-up node.

16. The shift register unit according to claim 15, wherein the carry signal output circuit comprises a carry signal output transistor, and wherein a control electrode of the carry signal output transistor is electrically connected to the pull-up node, a first electrode of the carry signal output transistor is electrically connected to the first clock signal terminal, and a second electrode of the carry signal output transistor is electrically connected to the carry signal output terminal.

17. A shift register unit, comprising:

a bias control circuit electrically connected to a pull-down node, a control clock signal terminal, and a bias voltage terminal, respectively, and the bias control circuit is configured to control connection between the pull-down node and the bias voltage terminal under the control of a control clock signal provided by the control clock signal terminal, wherein a bias voltage signal is inputted by the bias voltage terminal, wherein the bias control circuit comprises a bias control transistor, wherein a control electrode of the bias control transistor is electrically connected to the control clock signal terminal, a first electrode of the bias control transistor is electrically connected to the pull-down node, and a second electrode of the bias control transistor is electrically connected to the bias voltage terminal, wherein the shift register unit further comprises a pull-up node pull-down circuit and an output pull-down circuit, wherein the pull-up node pull-down circuit is electrically connected to the pull-down node, the pull-up node, and the first voltage terminal, respectively, is configured to control connection between the pull-up node and the first voltage terminal under the control of the potential of the pull-down node, and wherein the output pull-down circuit is electrically connected to the pull-down node, the gate driving signal output terminal, and the second voltage terminal, and is configured to control connection between the gate driving signal output terminal and the second voltage terminal under the control of the potential of the pull-down node.

18. A shift register unit, comprising:

a pull-up node control circuit;

a gate driving output circuit; and a bias control circuit electrically connected to a pull-down node, a control clock signal terminal, and a bias voltage terminal, respectively, and the bias control circuit is configured to control connection between the pull-down node and the bias voltage terminal under the control of a control clock signal provided by the control clock signal terminal, wherein a bias voltage signal is inputted by the bias voltage terminal, wherein the pull-up node control circuit is configured to control the potential of the pull-up node, wherein the gate driving output circuit is configured to control the gate driving signal outputted by the gate driving signal output terminal under the control of the potential of the pull-up node, wherein the pull-up node control circuit comprises an input transistor, a reset transistor, and a start transistor, wherein a control electrode of the input transistor and a first electrode of the input transistor are electrically connected to the input terminal, and a second electrode of the input transistor is electrically connected to the pull-up node, wherein a control electrode of the reset transistor is electrically connected to the reset terminal, a first electrode of the reset transistor is electrically connected to the pull-up node, and a second electrode of the reset transistor is connected to a first low voltage, wherein a control electrode of the starting transistor is electrically connected to a starting terminal, a first electrode of the starting transistor is electrically connected to the pull-up node, and a second electrode of the starting transistor is connected to the first low voltage, wherein the gate driving output circuit comprises an output transistor and a storage capacitor, wherein a control electrode of the output transistor is electrically connected to the pull-up node, a first electrode of the output transistor is electrically connected to the first clock signal terminal, and a second electrode of the output transistor is electrically connected to the gate driving signal output terminal, the first clock signal terminal is used to provide a first clock signal, and wherein a first end of the storage capacitor is electrically connected to the pull-up node, and a second end of the storage capacitor is electrically connected to the gate driving signal output end.

* * * * *